US012402458B2

(12) United States Patent
Ding et al.

(10) Patent No.: US 12,402,458 B2
(45) Date of Patent: Aug. 26, 2025

(54) DRIVING BOARD, DISPLAY PANEL, AND DISPLAY DEVICE

(71) Applicant: Shanghai Tianma Micro-Electronics Co., Ltd., Shanghai (CN)

(72) Inventors: Yimiao Ding, Shanghai (CN); Lihua Wang, Shanghai (CN); Tingting Li, Shanghai (CN); Pengfei Qiu, Shanghai (CN)

(73) Assignee: Shanghai Tianma Microelectronics Co., Ltd., Shanghai (CN)

( * ) Notice: Subject to any disclaimer, the term of this patent is extended or adjusted under 35 U.S.C. 154(b) by 485 days.

(21) Appl. No.: 17/942,926

(22) Filed: Sep. 12, 2022

(65) Prior Publication Data

US 2023/0020489 A1 Jan. 19, 2023

(30) Foreign Application Priority Data

Jun. 30, 2022 (CN) .......................... 202210767023.X

(51) Int. Cl.
*H10H 20/857* (2025.01)
*H01L 25/075* (2006.01)

(52) U.S. Cl.
CPC ....... *H10H 20/857* (2025.01); *H01L 25/0753* (2013.01)

(58) Field of Classification Search
CPC . H10H 20/857; H01L 25/0753; H01L 25/167; G09G 2300/0426; G09G 2300/0842; G09G 2320/0223; G09G 2330/04; G09G 3/3241; G09G 3/3426; G09G 3/32
See application file for complete search history.

(56) References Cited

U.S. PATENT DOCUMENTS

| | | | | |
|---|---|---|---|---|
| 2021/0320156 A1* | 10/2021 | Shang | ................ | H10K 59/1213 |
| 2021/0366427 A1* | 11/2021 | Xi | .......................... | G09G 3/3677 |
| 2022/0122549 A1* | 4/2022 | Choi | .................... | G09G 3/3233 |
| 2022/0344436 A1* | 10/2022 | Zhang | .................. | H10K 59/131 |

(Continued)

FOREIGN PATENT DOCUMENTS

| | | |
|---|---|---|
| CN | 111524931 A | 8/2020 |
| CN | 113678257 A | 11/2021 |

*Primary Examiner* — Victor A Mandala
(74) *Attorney, Agent, or Firm* — Christensen O'Connor Johnson Kindness PLLC

(57) ABSTRACT

Embodiments of the present disclosure provide a driving board, a display panel and a display device. The driving board includes a plurality of pixel regions; the pixel regions each include a pixel circuit, a first power supply structure and a second power supply structure; the first power supply structure is configured to provide a first power voltage and the second power supply structure is configured to provide a second power voltage; the driving board includes a substrate, the pixel circuit, the first power supply structure and the second power supply structure are located at a same side of the substrate; wherein at least one of the first power supply structure and the second power supply structure includes a block structure, at least one inorganic layer is provided at a side of the block structure away from the substrate; and the block structure includes a first block structure, the first block structure includes at least one first opening. The present disclosure can reduce the chance of display anomalies.

27 Claims, 10 Drawing Sheets

(56) References Cited

U.S. PATENT DOCUMENTS

| | | | | |
|---|---|---|---|---|
| 2022/0351680 A1* | 11/2022 | Choi | .................... | G09G 3/3233 |
| 2022/0352266 A1* | 11/2022 | Yang | .................. | H10K 59/1216 |
| 2023/0028746 A1* | 1/2023 | Yang | .................... | G09G 3/3258 |
| 2024/0268171 A1* | 8/2024 | Feng | ....................... | H01L 23/60 |
| 2025/0225934 A1* | 7/2025 | Wang | .................. | G09G 3/3233 |

* cited by examiner

DRIVING BOARD, DISPLAY PANEL, AND DISPLAY DEVICE

TECHNICAL FIELD

The present disclosure relates to the field of display technology, and more particularly to a driving board, a display panel, and a display device.

BACKGROUND

Light-emitting diodes (LEDs) can efficiently convert electrical energy into light energy, and are thus widely used in lighting, display, and medical devices in modern society. In the field of display, Micro-LEDs and mini LEDs can be used directly as sub-pixels in the display, or as backlights for liquid crystal displays (LCDs). Micro-LEDs are micrometer-sized LEDs, and mini LEDs are LEDs with chip sizes between 50 and 200 μm. Current LED display products suffer from display anomalies.

SUMMARY

Embodiments of the present disclosure provide a driving board, a display panel, and a display device to solve the problem of display anomalies in the related art.

In a first aspect, embodiments of the present disclosure provide a driving board, and the driving board includes a plurality of pixel regions and a substrate. The pixel regions each include a pixel circuit, a first power supply structure, and a second power supply structure. The first power supply structure is configured to provide a first power voltage, and the second power supply structure is configured to provide a second power voltage. The pixel circuit, the first power supply structure, and the second power supply structure are located at a same side of the substrate. At least one of the first power supply structure and the second power supply structure includes a block structure having at least one inorganic layer provided at a side of the block structure away from the substrate. The block structure includes a first block structure including at least one first opening.

In a second aspect, embodiments of the present disclosure provide a display panel based on the same invention concept, and the display panel includes the drive panel provided by any embodiments of the present disclosure.

In a third aspect, based on the same invention concept, embodiments of the present disclosure provide a display device including the display panel provided by any embodiments of the present disclosure.

BRIEF DESCRIPTION OF DRAWINGS

In order to more clearly explain the embodiments of the present disclosure or the technical solution in the related art, the drawings used in the description of the embodiments or the related art will be briefly described below. The drawings in the following description are some embodiments of the present disclosure. Those skilled in the art can obtain other drawings based on these drawings.

DETAILED DESCRIPTION

Figure 1:
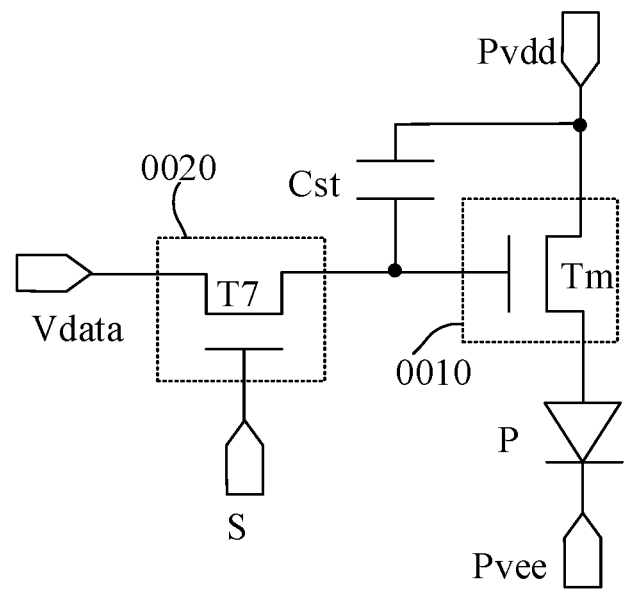
FIG. 1 is a schematic diagram of a pixel circuit in a driving board according to an embodiment of the present disclosure.

In order to better understand technical solutions of the present disclosure, the embodiments of the present disclosure are described in detail with reference to the drawings. It should be clear that the described embodiments are merely part of the embodiments of the present disclosure rather than all of the embodiments. It is obvious for those skilled in the art that other embodiments made based on the embodiments of the present disclosure fall within the protection scope of the present disclosure.

The terms used in the embodiments of the present disclosure are merely for the purpose of describing specific embodiment, rather than limiting the present disclosure. The terms "a", "an", "the", and "said" in a singular form in the embodiments of the present disclosure and the attached claims are also intended to include plural forms thereof, unless noted otherwise.

The inventors analyzed the reason why there are display anomalies in existing LED products. The LED display product is provided with a driving board, which is typically a structure in which metal layers and insulating layers are alternately stacked, including a pixel circuit for driving the LED to emit light. It has been found that there is a phenomenon of galvanic corrosion of the power supply structure in the driving board, which leads to a functional failure of the power supply structure, such as the shorting of the positive and negative power supply structures in the driving board due to galvanic corrosion, thereby leading to display anomalies. The inventors have further analyzed the reason for galvanic corrosion of the power supply structure to find that the overlying organic layer over the power supply structure is less dense, making the power supply structure susceptible to water and oxygen corrosion. In order to improve the corrosion resistance of the power supply structure, the inventive technology may include fabricating an inorganic insulating layer over the power supply structure, utilizing the high densification of the inorganic insulating layer to block corrosion of the power supply structure by water oxygen. However, in the manufacturing process, it is found that an abnormal discharge occurs when the driving board is placed in a CVD (Chemical Vapor Deposition) machine to fabricate the inorganic layer, and the abnormal discharge causes problems such as driving board breakage, film damage, and equipment damage. The inventors further analyzed the cause of the abnormal discharge, and found that when the power supply structure is a large-sized metal structure, such as the sum of the areas of the positive power supply structure and the negative power supply structure accounting for 85% over the entire driving plane, the manufacturing of the inorganic layer after the power supply structure process results in abnormal discharge of the driving plane and the CVD machine. The inventors found out that the driving board generates an electrostatic charge during the manufacturing process, and the electrostatic charge accumulates in the metal structure. The driving board is placed in the CVD tool after the process of the power supply structure to make the inorganic layer, and the driving board is damaged by damage due to the electrostatic charge present on the power supply structure when the amount of charges accumulated on the power supply structure is large enough so that the electrical potential difference exists between the power supply structure and the electrodes in the CVD tool to generate an electrostatic discharge. The driving board also causes chipping due to the electrostatic discharge. The design using the large-sized metal structure can reduce the resistance of the power supply structure, reduce the voltage drop, and increase the uniformity of the power supply voltage, but the large-sized structure causes abnormal discharge into the CVD tool, thereby limiting the fabrication of the inorganic layer after the power supply structure. How to fabricate an inorganic layer after a large-sized metal structure to effectively protect the metal structure to solve the display abnormality is then a problem to be solved.

To solve the problems of the related art, embodiments of the present disclosure provide a driving board that forms openings in a large-sized metal structure to partially block the large-sized metal structure using the openings. For example, the metal structure may be at least one power supply structure, and the at least one large-sized power supply structure may be separated by openings to form at least one power supply unit with a smaller area and still be electrically connected to each other. This can reduce the risk of abnormal discharge between the power supply structure and the CVD tool, and the inorganic insulating layer can be formed after the processing of the large-sized power supply structure, thereby improving the protection performance of the power supply structure, preventing corrosion of the metal, and solving the problem of displaying the abnormality.

Embodiments of the present disclosure provide a driving board including a plurality of pixel regions arranged in an array. The pixel regions each include a pixel circuit and a power supply structure. In some embodiments, the light emitting device is fixed within a pixel region of a driving board, which may serve as a backlight module to provide a light source for the liquid crystal display panel. In other embodiments, the light emitting devices are fixed in the pixel regions of the driving board as display panels. Each pixel region corresponds to one light emitting pixel in the display panel. The light emitting devices in the embodiments of the present disclosure may be Micro-LEDs or mini LEDs.

FIG. 1 is a schematic diagram of a pixel circuit in a driving board according to an embodiment of the present disclosure. As shown in FIG. 1, the pixel circuit includes a driving module 0010 and a data writing module 0020. The data writing module 0020 is configured to provide data signals to the pixel circuit, and the driving module 0010 is configured to provide a driving current to a light emitting device P. The driving module 0010 includes a driving transistor Tm, the data writing module 0020 includes a switching transistor T7, and the pixel circuit further includes a storage capacitor Cst. The gate of the switch transistor T7 is coupled with a scan line S, and the switch transistor T7 has a first terminal coupled with a data line Vdata, and a second terminal coupled with the gate of the driving transistor Tm. The storage capacitor Cst has one plate coupled with the positive power supply structure Pvdd, and the other plate coupled with the gate of the driving transistor Tm. The driving transistor Tm has a first electrode coupled with the positive power supply structure Pvdd, and a second electrode coupled with a first electrode of the light emitting device P. A second electrode of the light emitting device P is coupled with a negative power supply structure Pvee. A positive power supply structure Pvdd provides a positive power supply voltage, and the negative power supply structure Pvee provides a negative power supply voltage. The driving transistor Tm and the switching transistor T7 are both n-type transistors in FIG. 1, and in another embodiment, the transistors in the pixel circuit are p-type transistors, which are not illustrated herein.

Figure 2:
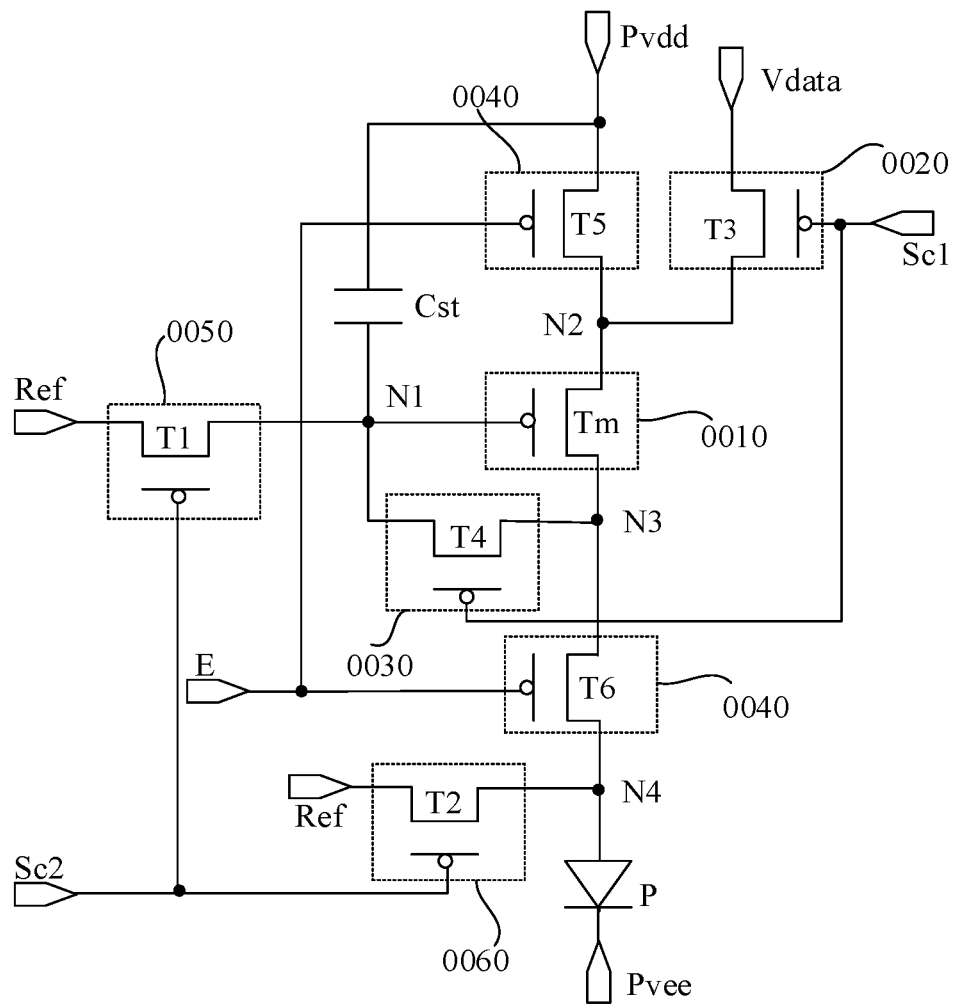
FIG. 2 is a schematic diagram of a pixel circuit in another driving board according to an embodiment of the present disclosure.

In another embodiment, FIG. 2 is a schematic diagram of a pixel circuit in another driving board according to an embodiment of the present disclosure. As shown in FIG. 2, the pixel circuit includes a driving module 0010, a data writing module 0020, a threshold compensation module 0030, a lighting control module 0040, a gate reset module 0050, an electrode reset module 0060, and a storage capacitor Cst. A control terminal of the driving module 0010 is coupled with a first node N1, a first terminal of the driving module 0010 is coupled with a second node N2, and a second terminal of the driving module 0010 is coupled with a third node N3. The data writing module 0020 is coupled with the second node N2, and the threshold compensation module 0030 is coupled in series to the first node N1 and the third node N3. The lighting control module 0040 is connected in series with the driving module 0010 and the light emitting device P. The gate reset module 0050 is coupled with the first node N1, the electrode reset module 0060 is coupled with the first electrode of the light emitting device P and a fourth node. The driving module 0010 includes a driving transistor Tm, the gate reset module 0500 includes a gate reset transistor T1, the electrode reset module 0060 includes an electrode reset transistor T2, the data writing module 0020 includes a data write transistor T3, the threshold compensation module 0030 includes a threshold compensation transistor T4, and the lighting control module 0040 includes a first lighting control transistor T5 and a second lighting control transistor T6. The gate reset transistor T1 has a first terminal coupled with the reset line Ref, a second terminal coupled with the first node N1, a gate coupled with the first node N1, a first terminal coupled with the second node N2, and a second terminal coupled with the third node N3. The drive transistor Tm is connected in series between the first lighting control transistor T5 and the second lighting control transistor T6. The first terminal of the data write transistor T3 is coupled with the data line Vdata, the second terminal of the data write transistor T3 is coupled with the second node N2, and the threshold compensation transistor T4 is connected in series between the first node N1 and the third node N3. A first plate of the storage capacitor Cst and a terminal of the first lighting control transistor T5 are coupled with the positive power supply structure Pvdd. A first electrode of the electrode reset transistor T2 is coupled with a reset line Ref, and a second electrode of the electrode reset transistor T2 and a first electrode of the light emitting device P are coupled with the fourth node N4. The second electrode of the light-emitting device P is coupled with the negative power supply structure Pvee. The gate of the data write transistor T3 and the gate of the threshold compensation transistor T4 are coupled with the first scan line Sc1, the gate of the gate reset transistor T1 and the gate of the electrode reset transistor T2 are coupled with the second scan line Sc2, and the gate of the first lighting control transistor T5 and the gate of the second lighting control transistor T6 are coupled with the lighting control line E. The driving transistor Tm and a switching transistor T7 are both p-type transistors in FIG. 2.

In another embodiment, the pixel circuit includes a driving module 0010, a data writing module 0020, a light lighting control module 0040, a gate reset module 0050, an electrode reset module 0060, and a storage capacitor Cst. But the pixel circuit does not include the threshold compensation module 0030 illustrated in FIG. 2. In another embodiment, the pixel circuit includes a driving module 0010, a data writing module 0020, a threshold compensation module 0030, a lighting control module 0040, a gate reset module 0050, and a storage capacitor Cst. But the pixel circuit does not include the electrode reset module 0060 illustrated in FIG. 2.

The pixel circuits in the embodiments described above are only schematic representations of some embodiments and do not constitute a limitation to the present disclosure. The pixel circuits in the driving board provided by the embodiment of the present disclosure can be any of those known in the art. In order to realize the light emitting device P to emit light, a power supply structure including a positive power supply structure Pvdd and a negative power supply structure Pvee illustrated in FIGS. 1 and 2 is provided in the driving board. In the related art, both the positive power supply structure Pvdd and the negative power supply structure Pvee in the display region are metal lines, that is, the positive power supply structure Pvdd is a metal line, the shape of the positive power supply structure Pvdd is similar to the shape of the data lines in the driving board, the width of the positive power supply structure Pvdd in the direction perpendicular to its extending direction is about 2-5 µm, and the line width of the positive power supply structure Pvdd is about 2-5 µm. The same structure of the negative power supply structure Pvee is similar to the structure of the positive power supply structure Pvdd, and the line width of the negative power supply structure Pvee is about 2-5 µm. In general, the positive power supply structure Pvdd and the negative power supply structure Pvee each transmit a constant voltage signal, that is, the positive power supply structures Pvdd at corresponding positions of different pixel regions in the entire surface of the driving board are electrically connected, and the negative power supply structures Pvee at corresponding positions of different pixel regions are electrically connected.

In order to improve the uniformity of the in-plane power supply voltage, at least one of the positive power supply structure Pvdd and the negative power supply structure Pvee is provided as a large-sized structure. A large-sized structure is conceptually different from a linear metal, and the two can be understood in contrast. In general, the metal lines such as data lines, scan lines and the like in the driving board are all line-shaped metal, and a large number of pixel circuits are arranged in the driving board, and the line width of the line metal is typically about 2-5 µm in order to meet the process capability and the function of the metal lines themselves. In other words, the width of a conventional linear metal in the direction perpendicular to its extension is typically 2-5 µm. The width of the large-sized structure defined in this embodiment in the direction perpendicular to its extension is much larger than the line width of the line metal. The large-sized structure is also explained in the following related drawings.

Figure 3:
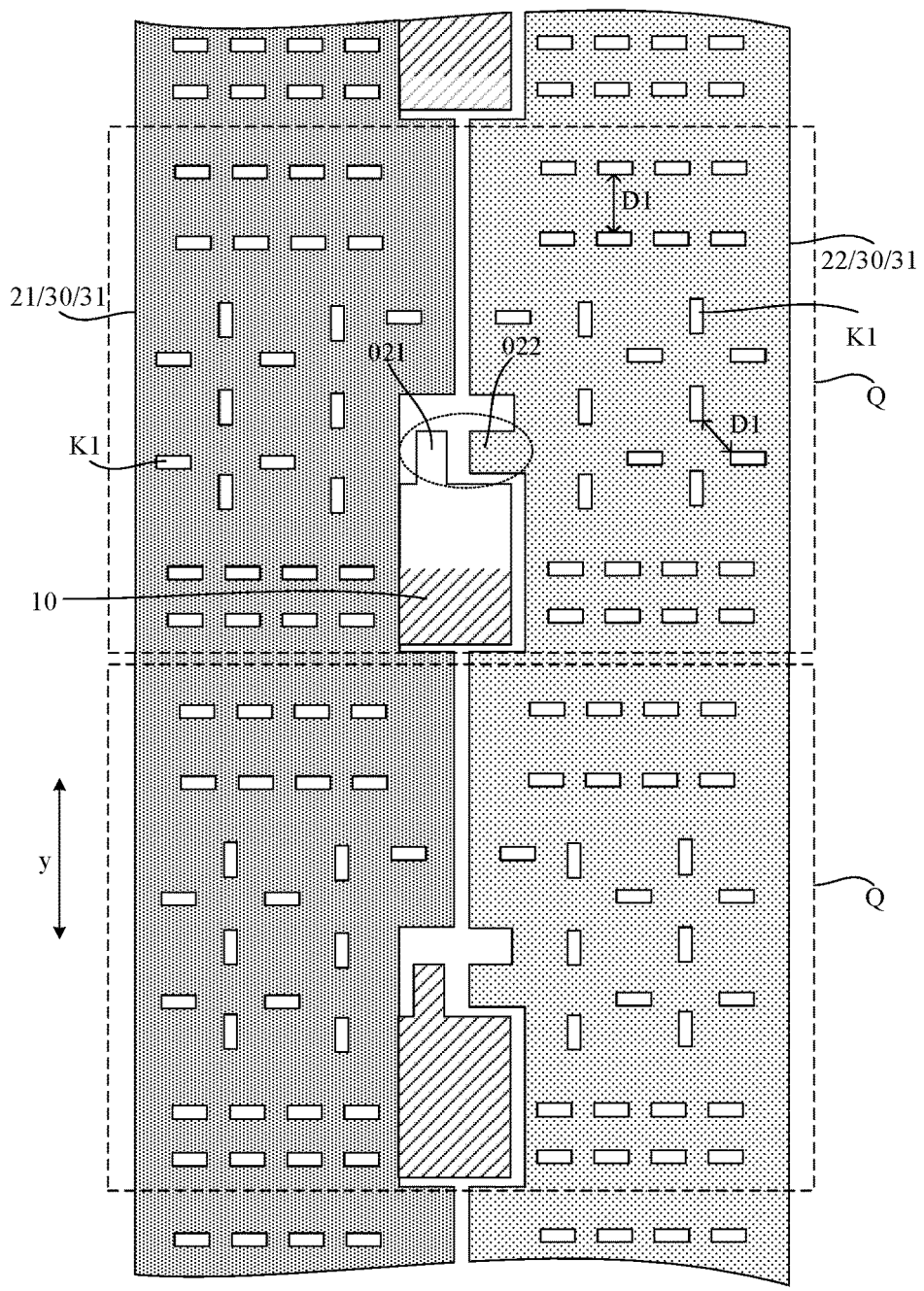
FIG. 3 is a partial top view of a driving board according to an embodiment of the present disclosure.

FIG. 3 is a schematic partial top view of a driving board according to an embodiment of the present disclosure.

As shown in FIG. 3, the pixel region Q includes a pixel circuit 10, a first power supply structure 21 for providing a first power voltage, and a second power supply structure 22 for providing a second power voltage. One of the first power supply structure 21 and the second power supply structure 22 is a positive power supply structure Pvdd and the other is a negative power supply structure Pvee. Each of the first power supply structure 21 and the second power supply structure 22 illustrated in FIG. 3 includes a block structure 30. In embodiments of the present disclosure, the block structure 30 is a block structure (i.e., bulk) in planar view rather than a conventional wire-like metal. The first power supply structure 21 and the second power supply structure 22 each provide a corresponding constant voltage signal, and are shaped as a block, so that the resistance can be reduced, thereby reducing power consumption.

It should be clear that the first power supply structure 21 and the second power supply structure 22 defined in the embodiment of the present disclosure are structures in the pixel region Q, which are defined from the perspective of a single pixel region Q as the power supply structures at their locations. Each of the first power supply structure 21 and the second power supply structure 22 in the pixel region Q includes a block structure 30, which differs from conventional wire-like metal structures in the pixel region Q. A conventional wire-like metal structure is a metal wire, which typically has a line width of about 2-5 µm, and the width of the block structure 30 in any direction in the plane of the block structure 30 in this embodiment is greater than 5 µm. In addition, in the pixel region Q, the area of the block structure 30 is larger than that of a single line metal structure.

In addition, the first power supply structure 21 in each pixel region Q has the same potential, and the second power supply structure 22 in each pixel region Q also has the same potential from the entire view of the driving board. As illustrated in FIG. 3, two-pixel regions Q arranged in the second direction y are illustrated. It can be seen that two first power supply structures 21 in the two-pixel regions Q are connected to each other, and there is no obvious boundary between the connected first power supply structures 21. The plurality of first power supply structures 21 in the corresponding plurality of pixel regions Q along the second direction y can be a unitary structure, and the plurality of first power supply structures 21 in the corresponding plurality of pixel regions Q along the second direction y can be considered to be connected to each other to form a first common power source. The shape of the first common power source is a strip from the whole view of the driving board. Compared to the metal lines in the pixel circuit in the driving board, the area of the first common power source is much larger than that of a single metal line. Similarly, as shown in FIG. 3, the two second power supply structures 22 in the two-pixel regions Q are connected to each other, and the first power supply structures 21 in the corresponding pixel regions Q along the second direction y are connected to each other to form a second common power source, and the second common power source may also be regarded as a large-area block structure when the second common power source is stripe-shaped from the perspective of the driving board. In some embodiments, one of the first power supply structure 21 and the second power supply structure 22 may be provided to include a block structure, the other being a conventional wire-like metal structure, which is not illustrated herein. The profile shape of the block structure 30 in FIG. 3 is only schematically illustrated, and it is within the scope of the present disclosure to deform only a partial profile on the basis of the shape illustrated in FIG. 3, such as to form the block structure 30 with a non-linear profile.

In the embodiment of FIG. 3, the block structure 30 includes only a first block structure. In some embodiments described below, the block structure 30 includes a first block structure and a second block structure.

As shown in FIG. 3, the block structure 30 includes a first block structure 31, which in this embodiment is the block structure 30. The first block structure 31 includes at least one first opening K1. The first opening K1 extends through the layers of the first block structure 31 in a direction perpendicular to the substrate direction. The first block structure 31 shown in FIG. 3 includes a plurality of first openings K1, and the shape, number, and arrangement of the first openings K1 are not limited. The first openings K1 may have any shape such as circular, rectangular, triangular, irregular pattern, and the first openings K1 may be arranged as shown in FIG. 3, or any other regular or irregular arrangement.

Taking the first power supply structure 21 as the positive power supply structure Pvdd and the second power supply structure 22 as the negative power supply structure Pvee as an example, in conjunction with the pixel circuit diagram illustrated in FIG. 1 or FIG. 2, it can be appreciated that the first power supply structure 21 is connected to a transistor in a pixel circuit, and the second power supply structure 22 is connected to one electrode of a light emitting device. Also shown in FIG. 3 are a first connection end 021 for electrical connection to the anode of the light emitting device and a second connection end 022 for electrical connection to the cathode of the light emitting device. In the embodiment of FIG. 3, a light emitting device may be mounted in a pixel region Q.

Figure 4:
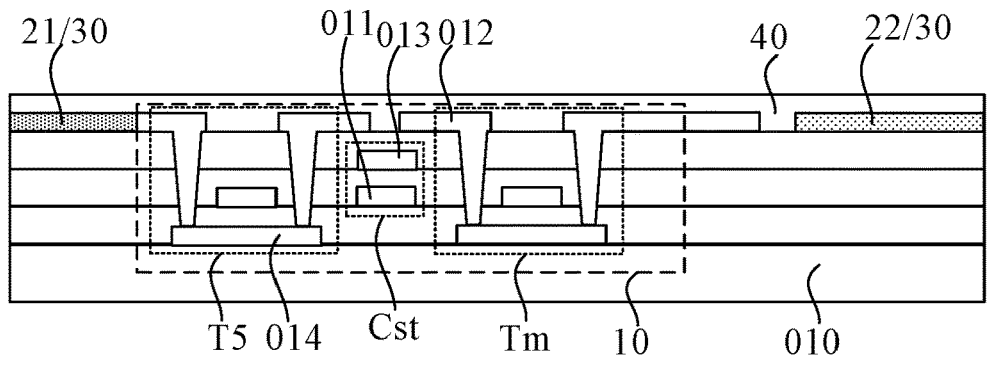
FIG. 4 is a cross-sectional view of a driving board according to an embodiment of the present disclosure.

FIG. 4 is a cross-sectional view of a driving board according to an embodiment of the present disclosure. As shown in FIG. 4, the driving board includes a substrate 010, a pixel circuit 10, a first power supply structure 21, and a second power supply structure 22 that are located at the same side of the substrate 010. The driving transistor Tm, the first lighting control transistor T5 and the storage capacitor Cst in the pixel circuit 10 are shown in FIG. 4. A terminal of the first lighting control transistor T5 is coupled with the first power supply structure 21. At least one inorganic layer 40 is provided at a side of the block structure 30 away from the substrate 010.

As shown in FIG. 4, the driving board includes a first metal layer 011, a second metal layer 012, a capacitor metal layer 013, and a semiconductor layer 014 that are located at the same side of the substrate 010. The second metal layer 012 is located at a side of the first metal layer 011 away from the substrate 010, the capacitor metal layer 013 is located between the first metal layer 011 and the second metal layer 012, and the semiconductor layer 014 is located between the first metal layer 011 and the substrate 010. An insulating layer, not shown in FIG. 4, is provided between the semiconductor layer 014 and the first metal layer 011 and between every two adjacent metal layers.

In the driving board provided by the embodiment of the present disclosure, at least one of the first power supply structure 21 and the second power supply structure 22 in the pixel region Q includes a block structure 30, that is, at least one power supply structure in the pixel region is provided as a large-sized structure rather than a conventional line-shaped metal, so as to reduce the resistance of the power supply structure, reduce the voltage drop across the entire power supply structure in the driving board, and enhance the uniformity of the power voltage signal in each pixel region Q of the driving board, while also reducing power consumption. The block structure 30 is set to include a first block structure 31 including at least one first opening K1 capable of partially separating a large-sized first block structure 31. It should be noted that, in the embodiment of the present disclosure, "partial separation" refers to the use of openings to separate the large-sized structure at the opening. The upper and lower sides (or left and right sides) of the structure are separated at the opening, but the large-sized structure remains continuous as a whole.

As the large-sized structure enters the CVD tool, the large-sized structure overlaps the electrodes in the CVD tool to form a large capacitance. The presence of charge in the large-sized structure is not limited in flow through the large-sized structure, so charge tends to accumulate in large quantities at some localized location. When the amount of locally accumulated charge in the large-sized structure is excessive, the possibility of abnormal discharge between the large-sized structure and the electrode in the CVD tool is increased.

This embodiment of the present disclosure utilizes the first opening K1 to separate the large-sized first block structure 31 into a plurality of small-sized structures that are still electrically connected to each other. The presence of the first opening K1 reduces the cross-sectional area of the internal flow of charge within the first block structure 31. This limits the mutual flow of charge between the small-sized structures separated by the first opening K1, which is equivalent to distributing the charge present on the first block structure 31, and reducing the amount of charge accumulated within the small-sized structures, that is, reducing the amount of charge accumulated locally on the first block structure 31. When the module is placed in the CVD tool after the processing of the block structure 30 to form the inorganic insulating layer, the first opening K1 separates the large-sized first block structure 31 into a plurality of small-sized structures still electrically connected to each other, the less the amount of accumulated charges in the small-sized structures is reduced, and the less the risk of ESD occurs.

The risk of abnormal discharge between the small-sized structures and the CVD tool is reduced, and the risk of abnormal discharge between the first block structure 31 and the CVD tool is reduced. In addition, the small-sized structures intermittently formed by the first openings K1 respectively overlap the electrodes in the CVD tool to form small capacitors, where both the small capacitors and the large capacitors have two plate overlap areas, the large overlap area indicates a large capacitor and the small overlap area indicates a small capacitor. Since the capacitors formed by overlapping the small-sized structures with the electrodes in the CVD tool respectively are smaller, the capacitors can store fewer charges. Even if abnormal discharge occurs, the energy generated by the discharge of fewer charges is less, and the damage is less, and no chip or electrode damage can occur. The process yield can be improved, and the cost can be reduced. In the embodiment of the present disclosure, the inorganic layer 40 is provided at the side of the first block structure 31 away from the substrate 010, and the ability of the inorganic material to block water and oxygen is used to effectively protect the first block structure 31 from corrosion, which meets the requirements of high temperature and high humidity operation environment. In addition, the performance reliability of the driving board is improved, and the possibility of abnormal occurrence is reduced.

Embodiments of the present disclosure utilize the first opening K1 to partially block the large-sized power supply structure to form a plurality of small-sized power supply units that are still electrically connected, thereby reducing the amount of charge that the large-sized power supply structure locally accumulates. The large-sized power supply structure is at least one of the first power supply structure 21 and the second power supply structure 22. When the driving board is manufactured, the module is placed in the CVD tool after the large-sized power supply structure is processed to fabricate the inorganic insulating layer, and the risk of abnormal discharge between the large-sized power supply structure and the CVD tool can be reduced due to the reduced amount of charge accumulated locally in the large-sized power supply structure, and the process yield can be increased and the cost can be reduced. Fabrication of the inorganic layer after the large-sized power supply structure process effectively protects the large-sized power supply structure from corrosion by using the superior ability of the inorganic material to block water and oxygen, improves the performance reliability of the driving board, and reduces the chance of display anomalies.

In the embodiment of the present disclosure, the first openings K1 of the first block structure 31 are arranged so as to partially block a large-sized first block structure 31 by the first openings K1. The first openings K1 penetrate through the film layer of the first block structure 31 in a direction perpendicular to the plane of the substrate, and the area of the individual first openings K1 and the opening density of the integrally arranged first openings K1 are not limited. The first openings K1 are openings on the first block structure 31, and no other conductive structures are provided in the first openings K1.

In the pixel region Q, the first openings K1 formed on the first block structure 31 have an influence on the resistance of the first block structure 31, such that the resistance of the first block structure 31 is increased. The larger the area of the first openings K1 has a larger influence on the resistance of the first block structure 31. The area of the first openings K1, and the opening density of the integrally provided first openings K1, has a complex dependency on the resistance influence of the first block structure 31 in terms of the contribution of the total area to the area of the first block structure 31. In practice, the area of the first opening K1 and the opening density of the integrally provided first opening K1 may be set as a total area according to specific design requirements.

As shown in FIG. 3, the first block structure 31 includes at least two first openings K1, and a distance between two adjacent first openings K1 is D1, and $D1 \leq 1$ mm. It should be noted that the distance between the two first openings K1 is calculated by the shortest distance between the edges of the two openings. In this embodiment, where the distance between two adjacent first openings K1 is not greater than 1 mm, at least one large-sized power supply structure can be partially isolated by the first openings K1 to form a plurality of power supply units having smaller areas and still being electrically connected to each other. The presence of the first openings K1 makes the cross-sectional area of the charges flowing inside the first block structure 31 smaller, and the charges flowing between the power supply units separated by the first openings K1 are restricted from flowing to each other. In this way, there are a smaller amount of charges accumulated by each of the power supply units, the risk of electrostatic discharge is smaller. The risk of abnormal discharge between each of the small-sized power supply units and the CVD tools is reduced, the risk of abnormal discharge between the large-sized power supply structure and the CVD tools is reduced, and the process yield can be improved and the cost can be reduced. The first block structure 31 is protected by an inorganic layer after the first block structure 31 is processed, and the performance reliability of the driving board is improved and the possibility of display abnormality is reduced.

In some embodiments, $D1 \leq 0.6$ mm, which makes it possible to reduce the size of the small-sized power supply units formed by the partial break, and restrict the charges from flowing between the small-sized power supply units separated by the first opening K1. In addition, it is also possible to further reduce the amount of large partially accumulated charges. The less risk of ESD, the less risk of abnormal discharge between each small-sized power supply unit and the CVD tool. The risk of abnormal discharge between the large-sized power supply structure and the CVD tool is reduced. Moreover, the overlapping area of the electrodes in the small-sized power supply unit and the CVD tool is further reduced, so that the capacitance formed therebetween is further reduced, and the amount of charge the small capacitor can store is reduced. Even if abnormal discharge occurs, the energy generated by the discharge of less charge amount is less, the damage is less, and the chip or electrode damage is not caused, the process yield can be improved, and the cost can be reduced.

Figure 5:
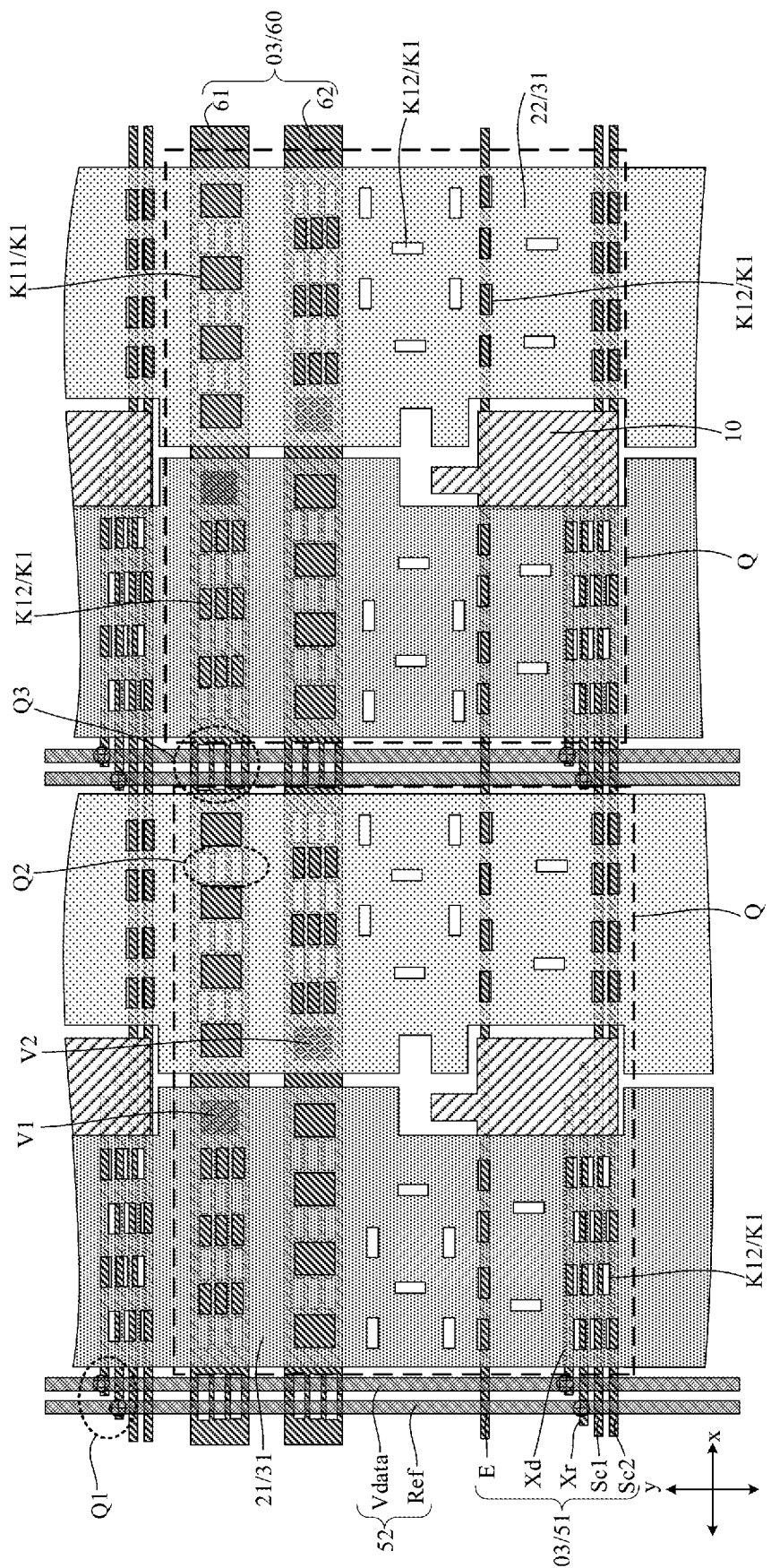
FIG. 5 is a partial view of another driving board according to an embodiment of the present disclosure.

In some embodiments, FIG. 5 is a partial view of another driving board according to an embodiment of the present disclosure, in which two adjacent pixel regions Q in a first direction x are illustrated. The driving board includes a first signal line 03 extending along a first direction x, and the first signal line 03 and the pixel circuit 10 are at the same side of the substrate 010. FIG. 5 is a top view of the driving board, where the top view is parallel to the plane perpendicular to the substrate 010, and it can be seen that the first signal line 03 overlaps the at least one first opening K1 along the plane perpendicular to the substrate 010. The first signal line 03 and the first block structure 31 are located on different layers, that is, the first signal line 03 and the large-sized power supply structure are on different layers. When the power supply structure is configured in the shape of the large-sized, the power supply structure overlaps the first signal line 03 to generate parasitic capacitance. Providing the first signal line 03 to be overlapped with the at least one first opening K1 in a direction perpendicular to the plane of the substrate 010 can reduce the overlapping area between the first signal line 03 and the first block structure 31. This reduces the parasitic capacitance between the first signal line 03 and the power supply structure, and lowers the loading on the first signal line 03 and the power supply structure, thus reducing the voltage drop on the first signal line 03 and the voltage drop on the power supply structure, and improving the brightness uniformity of the light emitting device in each pixel region Q on the driving board, and improving the power consumption.

In the embodiment of the present disclosure, the number of the first openings K1 overlapping the same one of the first signal lines 03 along a direction perpendicular to the plane of the substrate 010 is not limited. As shown in FIG. 5, at least two first openings K1 arranged in the first direction x overlap the same first signal line 03.

In one embodiment, FIG. 5 is discussed in conjunction with the pixel circuit illustrated in FIG. 2 above. As shown in FIG. 5, the driving board further includes a driving signal line coupled with the pixel circuit 10, and FIG. 5 simply illustrates the pixel circuit 10 as a graphic block, and the location where the driving signal line is coupled with the pixel circuit 10 is not shown. The driving signal lines include first driving signal lines 51 that extend in a first direction x and second driving signal lines 52 that extend in a second direction y that crosses the first direction x. The first driving signal line 51 includes a first scan line Sc1, a second scan line Sc2, a lighting control line E, a data signal line segment Xd, and a reset signal line segment Xr, and the second driving signal line 52 includes a data line Vdata and a reset line Ref, where the data signal line segment Xd is connected to the data line Vdata through a via formed through the insulating layer, and the reset signal line segment Xr is connected to the reset line Ref through a via formed through the insulating layer. The area Q1 circled in FIG. 5 is where the data signal line segment Xd connects with the data line Vdata via, and the reset signal line segment Xr connects with the reset line Ref via.

Depending on the structure of the pixel circuit, the type and number of driving signal lines provided in the driving board may be different, and FIG. 5 merely serves as an alternative embodiment of the present disclosure and is not a limitation of the present disclosure.

As shown in FIG. 5, the first power supply structure 21 and the second power supply structure 22 are adjacent to each other in the pixel region Q along the first direction x. FIG. 5 schematically illustrates two-pixel regions Q, and it can be seen that the first power supply structures 21 and the second power supply structures 22 are alternately arranged in the first direction x. To further reduce the resistance on the power supply structure, embodiments of the present disclosure provide a power connection 60 (also referred to as a power connection line).

The power connection line 60 includes a first power connection line 61 for electrically connecting two adjacent first power supply structures 21 along the first direction x and a second power connection line 62 for electrically connecting two adjacent second power supply structures 22 along the first direction x. The first power connection line 61 connects to the first power supply structure 21 through a first through insulator via V1, and the second power connection line 62 connects to the second power supply structure 22 through a second through insulator via V2.

In some embodiments, the first signal line 03 includes a power connection line 60. As can be seen from the top view of FIG. 5, the first power supply structure 21 includes a first block structure 31 overlapping the second power connection line 62 overlapping the at least one first opening K1 along a direction perpendicular to the plane of the substrate 010. The second power supply structure 22 includes a first block structure 31 overlapping the first power connection line 61 overlapping the at least one first opening K1 along a direction perpendicular to the plane of the substrate 010. In this embodiment, each of the first power supply structure 21 and the second power supply structure 22 includes a first block structure 31, that is, both the positive power supply structure and the negative power supply structure are arranged in a large-sized structure, which can reduce the resistance of the power supply structure, improve the uniformity of the power supply voltage signal in the entire pixel region Q of the driving board, and reduce the power consumption. The first openings K1 are provided to partially block the first block structure 31, and the amount of charge accumulated locally in the first block structure 31 can be reduced. In the manufacturing of the driving board, the module is placed in the CVD tool after the power supply structure process to fabricate the inorganic insulating layer, and the amount of charges accumulated locally in the power supply structure is reduced due to the presence of the first opening K1, thereby reducing the risk of abnormal discharge between the power supply structure and the CVD tool. This can improve the process yield and reduce the cost. It is possible to provide the inorganic layer 40 at the side of the power supply structure away from the substrate 010, to effectively protect the power supply structure from the ability of the inorganic material to block water and oxygen, to prevent the power supply structure from corrosion, to improve the performance reliability of the driving board, to satisfy the requirement of high temperature and high humidity operation environment, and to reduce the occurrence of abnormal display. In addition, disposing the first power connection line 61 to electrically connect the plurality of first power supply structures 21 alternately arranged in the first direction x to each other in the driving board can further reduce the voltage drop on the first common power source. Disposing the second power connection line 62 to electrically connect the plurality of second power supply structures 22 alternately arranged in the first direction x to each other in the driving board can further reduce the voltage drop on the second common power source. Disposing the second power connection line 62 to overlap the at least one first opening K1 in a direction perpendicular to the plane of the substrate 010, the first power connection line 61 to overlap the at least one first opening K1 can reduce the parasitic capacitance caused by the overlap of the second power connection line 62 and the first power supply structure 21, and the parasitic capacitance caused by the overlap of the first power connection line 61 to the second power supply structure 22 can also be reduced, and power consumption can be reduced.

As shown in FIG. 5, the first opening K1 includes a first sub-opening K11 and a second sub-opening K12, and an area of the first sub-opening K11 is larger than an area of the second sub-opening K12; the power connection line 60 overlaps at least one of the first sub-openings K11 in a direction perpendicular to a plane of the substrate 010. Taking the first power connection line 61 as an example, in order to reduce the resistance of the first power connection line 61 itself, the first power connection line 61 can be made to have a wider line width, while the first sub-opening K11 with a larger area overlaps the first power connection line 61, the parasitic capacitance caused by the overlapping of the first power connection line 61 and the second power supply structure 22 can be reduced, the uniformity of the power voltage signal in the entire pixel region Q of the driving board can be improved, and the power consumption can be reduced.

In some embodiments, as shown in FIG. 5, the power connection line 60 overlaps the at least one first sub-opening K11, while the power connection line 60 overlaps the at least one second sub-opening K12. Taking the first power connection 61 (also referred to as the first power connection line) as an example, the first power connection 61 overlaps with the first block 31 included in the second power supply structure 22, and the first opening K1 formed on the first block 31 partially isolates the first block 31, while the first opening K1 has relative influence on the resistance of the first block 31 as a whole. Providing the first power connection line 61 to overlap both the first sub-opening K11 and the second sub-opening K12 facilitates balancing between the overall resistance of the first block structure 31 and the reduction of the parasitic capacitance caused by the overlap of the first power connection line and the first block structure 31.

In some embodiments, as illustrated in FIG. 5 in the regions Q2 and Q3, the first power connection line 61 has openings through the film layer in which it is located. The first power connection line 61 overlaps the first block structure 31 in the region Q2, and an opening is made in the first power connection line 61 to reduce parasitic capacitance caused by the first power connection line 61 overlapping the first block structure 31. The first power connection line 61 overlaps the second driving signal line 52 in the region Q3. Therefore, making an opening on the first power connection line 61 can reduce the parasitic capacitance caused by the overlapping of the first power connection line 61 and the second driving signal line 52, and thus the load on the second driving signal line 52 can be reduced.

In some embodiments, as shown in FIG. 5, the first signal line 03 includes a first driving signal line 51, that is, the first signal line 03 includes at least one of a first scan line Sc1, a second scan line Sc2, a lighting control line E, a data signal line segment Xd, and a reset signal line segment Xr. Providing the first driving signal line 51 overlapping the at least one first opening K1 can reduce parasitic capacitance caused by the first driving signal line 51 overlapping the first block structure 31 in a direction perpendicular to the plane of the substrate 010, thereby reducing loading on the first driving signal line 51 and improving brightness uniformity of the light-emitting device in each pixel region Q on the driving board. In addition, the load on the first block structure 31 can also be reduced, reducing power consumption.

As shown in FIG. 5, the first driving signal line 51 overlaps the at least one second sub-opening K12 in a direction perpendicular to the plane of the substrate 010. In order to accommodate the size of the transistors in the pixel circuit 10, to minimize the space occupied by the pixel circuit 10, the second sub-opening K12 having a smaller area according to the line width of the first driving signal line 51 is arranged to overlap with the second sub-opening K12, which is arranged to minimize the capacitance caused by the first driving signal line 51 and the first block structure 31 overlapping along a direction perpendicular to the plane of the substrate 010, so as to reduce the load on the first driving signal line 51, and to improve the brightness uniformity of the light emitting device in each pixel region Q on the driving board. In addition, the second sub-opening K12 with a smaller area has less influence on the resistance of the first block structure 31 as a whole.

In one embodiment, as shown in FIG. 5, the second driving signal line 52 is located between two adjacent pixel regions Q along the first direction x. The second driving signal line 52 and the first driving signal line 51 are located at different layers, and some first driving signal lines 51 are coupled with the second driving signal line 52. The second driving signal line 52 includes a data line Vdata coupled with the data line Vdata and a reset line Ref coupled with the reset line Ref. A second driving signal line 52 extending in the second direction y is provided at the periphery of the first power supply structure 21 and the second power supply structure 22, and the second driving signal line 52 need not overlap the first power supply structure 21 or the second power supply structure 22. The coupling of the second driving signal line 52 to the pixel circuit 10 through the corresponding first driving signal line 51 can reduce the overlapping area with the first block structure 31 and the signal line, reducing the influence of parasitic capacitance on the loading of the signal line.

Figure 6:
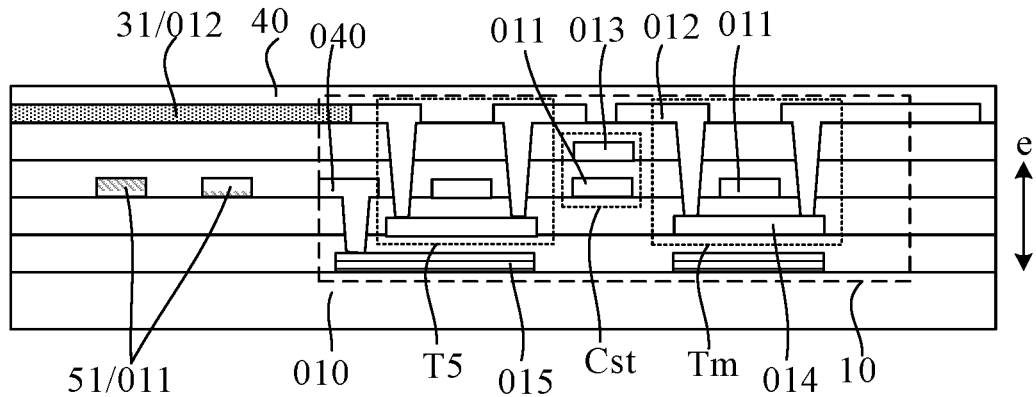
FIG. 6 is a schematic diagram of a membrane layer structure of another driving board according to an embodiment of the present disclosure.

In one embodiment, as shown in FIG. 6, which is a membrane layer structure of another driving board provided in the embodiment of the present disclosure, the driving board includes a first metal layer 011 and a second metal layer 012 that are located at the same side of the substrate 010, and the second metal layer 012 is located at a side of the first metal layer 011 away from the substrate 010. The first driving signal line 51 is on the first metal layer 011 and the first block structure 31 is on the second metal layer 012. The driving board further includes a capacitor metal layer 013 between the first metal layer 011 and the second metal layer 012 and a semiconductor layer 014 between the first metal layer 011 and the substrate 010. One plate of the storage capacitor Cst is on the capacitor metal layer 013 and the other plate is on the first metal layer 011. An insulating layer is provided between the semiconductor layer 014 and the first metal layer 011 and between each adjacent metal layer, which is not shown in FIG. 6. The first driving signal line 51 is provided on the first metal layer 011, and the first block structure 31 is provided on the second metal layer 012 such that at least two insulating layers are provided therebetween. The separation distance between the first driving signal line 51 and the first block structure 31 in the direction e perpendicular to the plane of the substrate 010 is large, so as to reduce the parasitic capacitance therebetween.

In one embodiment, the first metal layer 011 and the capacitor metal layer 013 are made of materials including titanium and aluminum. Alternatively, the second metal layer 012 is a titanium/aluminum/titanium tri-layer structure.

In some embodiments, the second driving signal line 52 is provided on the same layer as the first block structure 31, such that the second driving signal line 52 is provided at the periphery of the first power supply structure 21 and the second power supply structure 22, the overlapping area with the first block structure 31 and the signal line can be reduced, and the influence of the parasitic capacitance on the loading of the second driving signal line 52 can be reduced, and the brightness uniformity of the light emitting device in each pixel region Q on the driving board can be improved.

In addition, as shown in FIG. 6, the driving board further includes a light-shielding metal layer 015 located at a side of the semiconductor layer 014 close to the substrate 010. The light-shielding metal layer 015 overlaps the channel of the transistor in a direction e perpendicular to the plane of the substrate 010. The active layer of the transistor is located on the semiconductor layer 014, and the channel of the transistor is a portion of the active layer that overlaps the gate of the transistor in the direction e perpendicular to the plane of the substrate 010. The blocking of the channel of the transistor by the light shielding metal layer 015 prevents light from entering the channel from the side of the substrate 010 and ensures stable transistor characteristics. The light shielding metal layer 015 shown in FIG. 6 is connected to the electrode 040 on the first metal layer 011 through the via of the insulating layer, so that the structure of the double gate transistor can be formed and the characteristic performance of the transistor can be enhanced. In addition, FIG. 6 illustrates that one plate of the storage capacitor Cst is provided on the capacitor metal layer 013 and the other plate is provided on the first metal layer 011. In this embodiment, the shielding metal layer 015 and the plate on the capacitor metal layer 013 are further provided to overlap in the direction perpendicular to the plane of the substrate 010 to increase the capacitance of the memory capacitor Cst.

Figure 7:
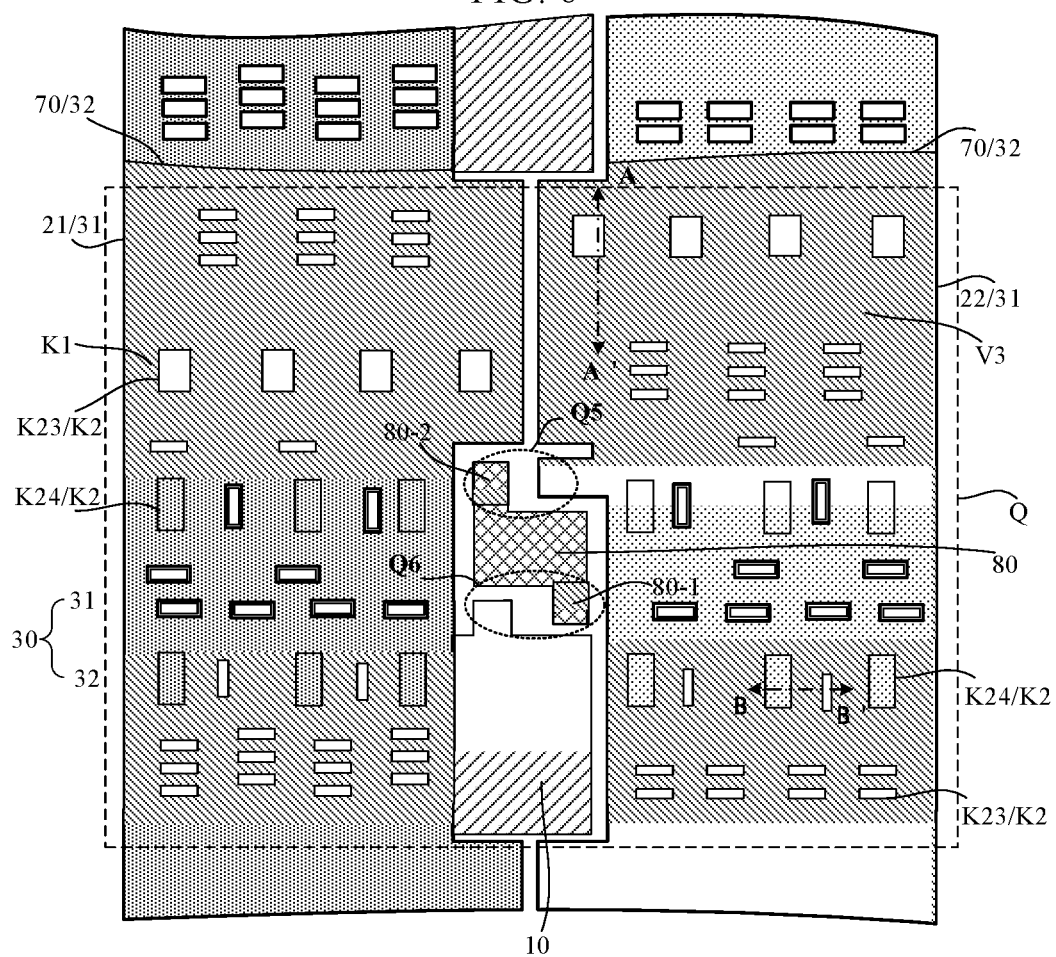
FIG. 7 is a schematic diagram of another driving board according to an embodiment of the present disclosure.
Figure 8:
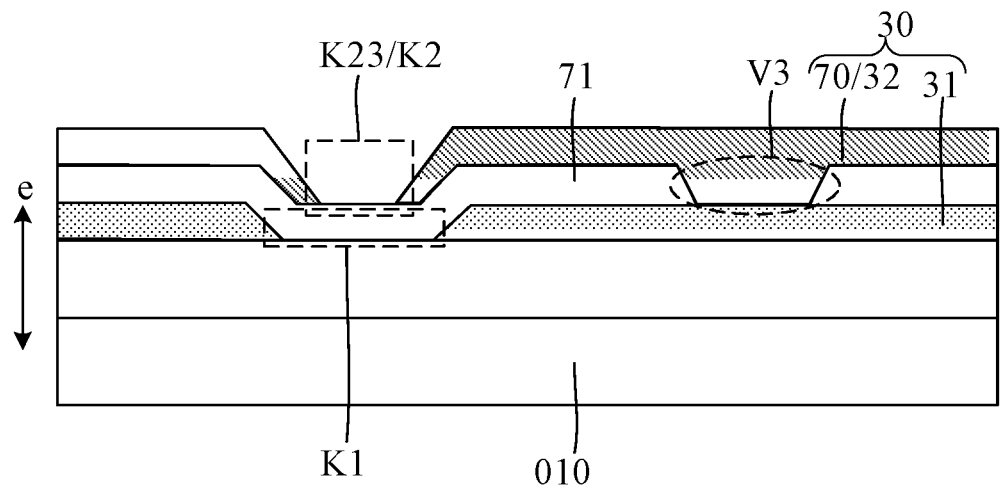
FIG. 8 is a cross-sectional view taken along line A-A' shown in FIG. 7 according to an embodiment of the present disclosure.

In some embodiments, FIG. 7 is a schematic diagram of another driving board provided by the embodiment of the present disclosure, and FIG. 8 is a cross-sectional view along line A-A' shown in FIG. 7. A pixel region Q is illustrated in FIG. 7, and structures such as driving signal lines and power connection lines are not shown. As seen in conjunction with FIGS. 7 and 8, the driving board further includes an auxiliary power supply structure 70. The auxiliary power supply structure 70 is located at a side of the first block structure 31 away from the substrate 010 with a first insulating layer 71 therebetween, and the auxiliary power supply structure 70 and the first block structure 31 are connected through at least two vias V3 penetrating the first insulating layer 71. That is, the auxiliary power supply structure 70 is connected in parallel with the first block structure 31. In FIG. 7, the first power supply structure 21 includes a first block structure 31, and the second power supply structure 22 includes a first block structure 31.

Only one structure is illustrated in FIG. 7 in one pixel region Q where two auxiliary power supply structures 70 are provided. One auxiliary power supply structure 70 is connected in parallel with the first block structure 31 of the first power supply structure 21 and the other auxiliary power supply structure 70 is connected in parallel with the first block structure 31 of the second power supply structure 22. In the second direction y, the auxiliary power supply structures 70 connected to the first power supply structure 21 in the adjacent pixel regions Q are connected to each other, and the auxiliary power supply structures 70 connected to the second power supply structure 22 in the adjacent pixel regions Q are connected to each other. That is, the driving board includes two auxiliary power supply structures in planar view, where one auxiliary power supply structure is connected in parallel with the first common power source, and the other auxiliary power supply structure is connected in parallel with the second common power source.

In the embodiment of the present disclosure, the first opening K1 is formed on the first block structure 31, and the first opening K1 is used to partially block the first block structure 31, and the cross-sectional area of the first opening K1 in the first block structure 31 is such that the charge passing through the first block structure 31 becomes smaller. In this way, the mutual flow of charges between the small-sized structures separated by the first opening K1 is limited, and the amount of charges present on the first block structure 31 can be reduced. When the module is placed in the CVD tool after the bulk process to make the inorganic insulating layer during the manufacturing of the driving board, the risk of abnormal discharge between each small-sized structure and the CVD tool is reduced due to the presence of the first opening K1 such that the amount of accumulated charge in each small-sized structure is reduced, and the risk of abnormal discharge between the first block structure 31 and the CVD tool is also reduced. The disposition of the first opening K1 has a certain effect on the overall resistance of the first block structure 31, and by disposing the auxiliary power supply structure 70 in parallel with the first block structure 31, the resistance of the power supply structure can be reduced, the voltage drop of the power supply structure can be reduced, the uniformity of the power supply voltage signal in the entire surface of the driving board in the plurality of pixel regions Q can be improved, and the power consumption can also be reduced.

In other embodiments, only one auxiliary power supply structure 70 is provided in the pixel region Q, and the auxiliary power supply structure 70 is connected in parallel with the first block structure 31 of one of the first power supply structure 21 and the second power supply structure 22. The figures are not illustrated herein.

In some embodiments, the first insulating layer 71 includes an inorganic insulating layer.

In other embodiments, the first insulating layer 71 includes an organic insulating layer.

As shown in FIGS. 7 and 8, the block structure 30 further includes a second block structure 32 at a side of the first block structure 31 away from the substrate 010, the second block structure 32 includes at least one second opening K2; and the auxiliary power supply structure 70 includes the second block structure 32. That is, providing the auxiliary power supply structure 70 with a large-sized can reduce the resistance of the auxiliary power supply structure 70, thereby utilizing the auxiliary power supply structure 70 to be connected in parallel with the first block structure 31, further reducing the resistance of the power supply structure to further improve the uniformity of the power supply voltage signal across the pixel regions Q of the driving board. In addition, disposing the second openings K2 on the second block structure 32 to partially block the large-sized second block structure 32 by the second openings K2 restricts the charges from flowing to each other between the small-sized structures separated by the second openings K2, which is equivalent to distributing the charges present on the second block structure 32 to reduce the amount of charges accumulated in the small-sized structures and to reduce the amount of charges accumulated in the small-sized structures. During the process of forming the driving board, the module is placed in the CVD tool after the second block structure 32 is processed to form the inorganic insulating layer, and since the second opening K2 breaks up the large-sized second block structure 32 into a plurality of small-sized structures still electrically connected to each other, the lower the amount of accumulated charges in the small-sized structures, and the less the risk of ESD, the risk of abnormal discharge between the small-sized structures and the CVD tool is reduced, and the risk of abnormal discharge between the second block structure 32 and the CVD tool is reduced. The inorganic layer can be provided at the side of the second block structure 32 away from the substrate 010, and the ability of the inorganic material to block water and oxygen is used to effectively protect the second block structure 32, prevent the second block structure 32 from corrosion, improve the performance reliability of the driving board, meet the requirement of high temperature and high humidity operation environment, and reduce the possibility of showing abnormal occurrence.

As shown in FIG. 7, the second block structure 32 includes at least two second openings K2 with a distance D2 between adjacent two of the second openings K2, and D2≤1 mm. The distance between the two second openings K2 is calculated as the shortest distance between the edges of the two openings. In this embodiment, when the distance between adjacent two of the second openings K2 is not greater than 1 mm, the second openings K2 can be used to partially block the large-sized second block structure 32, the amount of charge accumulated locally by the second block structure 32 can be reduced, and the risk of abnormal discharge between the large-sized second block structure 32 and the CVD tool can be reduced when the inorganic layer is formed after the process of the second block structure 32, the process yield can be improved, and the cost can be reduced.

In one pixel region Q, the total area of the second openings K2 is S1, and the area of the second block structure 32 is S0, where S1/S0>0.1. The second openings K2 are formed in the second block structure 32 to partially separate the large-sized second block structure 32 to reduce the amount of charge accumulated locally in the second block structure 32. In some embodiments, the insulating layer between the second block structure 32 and the first block structure 31 includes an organic insulating layer, which is heated to release gas during the manufacturing process, and defines the total area of the second openings K2 in the area of the second block structure 32, such that there is a large enough open area at the location of the second block structure 32 to facilitate the venting of the gas, preventing the gas released from the organic insulating layer from venting causing the film to peel off.

In some embodiments, S1/S0>0.2.

As shown in FIG. 8, the second opening K2 includes a third sub-opening K23; the front projection of the third sub-opening K23 on the substrate 010 is located within the front projection of the first opening K1 on the substrate 010. That is, in the direction e perpendicular to the plane of the substrate 010, the third sub-opening K23 overlaps the first opening K1, and the area of the third sub-opening K23 is smaller than the area of the first opening K1, so as to facilitate the slow ramping of the subsequently formed film at the opening position to ensure the continuity of the film.

In some embodiments, the auxiliary power supply structure 70 and the first block structure 31 are made of a same material. Referring to the schematic diagram of the driving board film illustrated in the embodiment of FIG. 6, the first block structure 31 is provided on the second metal layer 012. In some embodiments, a third metal layer is provided at a side of the second metal layer 012 away from the substrate 010, the auxiliary power supply structure 70 is provided on the third metal layer, and the third metal layer, and the second metal layer 012 are made of a same material. The third metal layer and the second metal layer 012 are made of materials including titanium and aluminum. The resistance of the metal structure formed by the third metal layer and the second metal layer 012 is relatively small. The auxiliary power supply structure 70 is provided in the same material as the first block structure 31, the auxiliary power supply structure 70 is provided in the third metal layer, the first block structure 31 is provided in the second metal layer 012, and the first block structure 31 and the auxiliary power supply structure 70 are connected in parallel, and the resistance of the power supply structure can be reduced, thereby reducing the voltage drop and improving the uniformity of the power supply voltage signal in the driving board.

Figure 9:
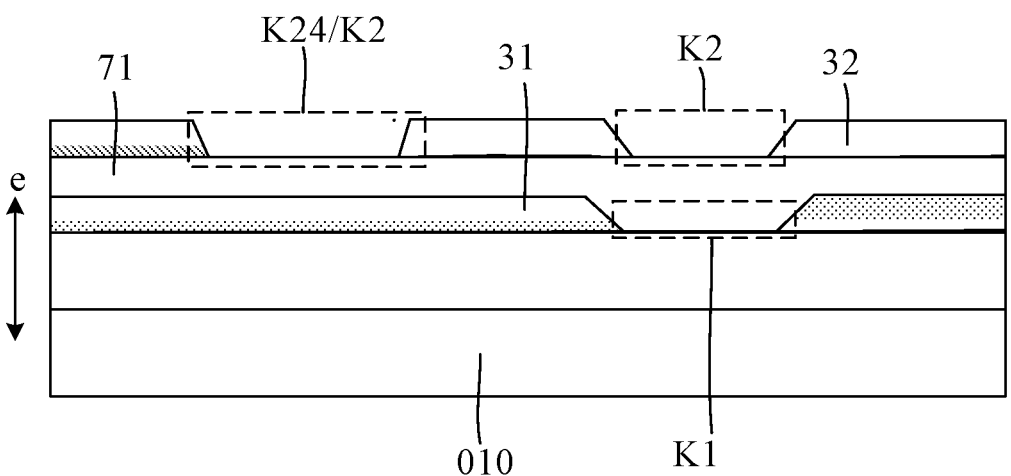
FIG. 9 is a cross-sectional view taken along line B-B' shown in FIG. 7 according to an embodiment of the present disclosure.

In some embodiments, FIG. 9 is a cross-sectional view taken along line B-B' shown in FIG. 7. As shown in FIG. 9, the second opening K2 includes a fourth sub-opening K24; along a direction e perpendicular to the plane of the substrate 010, the fourth sub-opening K24 does not overlap the first opening K1, that is, the fourth sub-opening K24 overlaps the non-opening region of the first block structure 31. The first insulating layer 71 between the second block structure 32 and the first block structure 31 includes an organic insulating layer, the organic insulating layer is heated to release gas during the process, the gas can be exhausted through the fourth sub-opening K24, and the gas released from the organic insulating layer cannot be exhausted to cause the film to be peeled off.

Also illustrated in FIG. 9 is a second opening K2 overlapping the first opening K1 in a direction perpendicular to the plane of the substrate 010. The first insulating layer 71 includes an organic insulating layer, the first insulating layer 71 can act as a planarization, and in this case the size relationship between the area of the second opening K2 and the area of the first opening K1 may not be limited.

Figure 10:
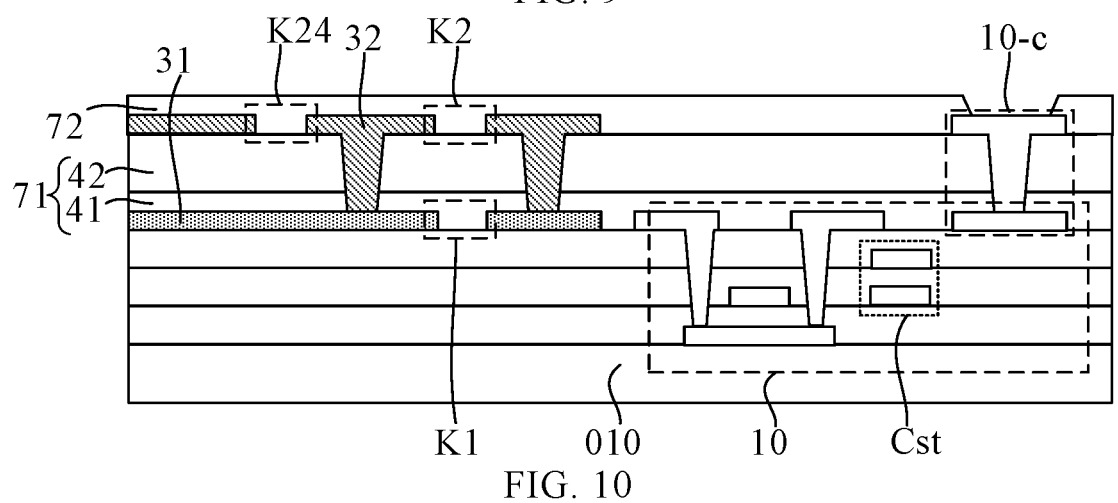
FIG. 10 is a schematic diagram of a membrane layer of another driving board according to an embodiment of the present disclosure.

In another embodiment, an organic insulating layer is included between the second block structure 32 and the first block structure 31. As shown in FIG. 10, the first insulating layer 71 between the second block structure 32 and the first block structure 31 includes a first sub inorganic layer 41, which is an organic insulating layer, and a first organic sub-layer 42, which is an inorganic insulating layer. The first organic sub-layer 42 is at a side of the first sub inorganic layer 41 away from the first block structure 31. Alternatively, the material of the first block structure 31 includes titanium metal and aluminum metal. In one embodiment, the first block structure 31 is a titanium/aluminum/titanium tri-layer metal structure, the thickness of the first block structure 31 is relatively thick, the thickness of the first sub-inorganic layer 41 formed over the first block structure 31 is relatively thin, and the first block structure 31 may not be completely covered and there are defects, such as a slope formed at the edge location of the first block structure 31, and the thin first sub-inorganic layer 41 may not be completely covered at the slope location, resulting in the edge of the first block structure 31 being exposed and easily corroded, but the first sub-inorganic layer 41 is highly dense and has excellent water oxygen barrier capability, and is able to provide a good barrier to water oxygen attack of the first block structure 31. In the embodiment of the present disclosure, a thick first organic sub-layer 42 is formed after the process of the first sub inorganic layer 41, the organic layer and the inorganic layer are formed differently, and the first organic sub-layer 42 has certain flowability to cover the slope position well in the early stage of the formation, and the portion of the first block structure 31 that may not be covered by the first sub inorganic layer 41 is covered by the first organic sub-layer 42 to improve the protection of the first block structure 31. In this embodiment, the second block structure 32 includes a fourth sub-opening K24 through which the first organic sub-layer 42 is heated to release a gas during the manufacturing process, and the gas can be exhausted, preventing the gas released from the first organic sub-layer 42 from being exhausted to cause peeling of the film, and enhancing the structural stability of the film.

As shown in FIG. 10, a second insulating layer 72 is provided at a side of the second block structure 32 away from the substrate 010 for protecting the second block structure 32 at the side of the second block structure 32 away from the substrate 010. Optionally, the second insulating layer 72 includes at least one inorganic layer. The ability to effectively shield the second block structure 32 from water and oxygen of the inorganic material can improve the performance reliability of the driving board. At the same time that the second openings K2 are used to partially block the second block structure 32, the risk of abnormal discharge between the second block structure 32 and the CVD tool can be reduced when the second insulating layer 72 is formed after the process of the second block structure 32, and the process yield can be increased and the cost can be reduced.

In some embodiments, as shown in FIG. 7, the pixel region Q further includes a connection electrode 80 having one end corresponding to the output end of the pixel circuit 10 and the other end corresponding to the second power supply structure 22. As understood in connection with the schematic diagram of the pixel circuit 10 illustrated in FIG. 1 or FIG. 2, the output terminal of the pixel circuit 10, namely the output port at which the pixel circuit 10 operates to output the driving current to the light emitting device. The light emitting devices need to be bonded in the pixel region Q. "Corresponding" defined in this embodiment means having some association between the two and a one-to-one correspondence. In this embodiment of the present disclosure, the connection electrode 80 has a "Z" shape, the connection electrode 80 is located between the first power supply structure 21 and the second power supply structure 22, the connection electrode 80 includes a first protrusion 80-1 and a second protrusion 80-2, and the connection electrode 80 is capable of functioning as a connecting wire, such as the region Q5 and the region Q6 illustrated in FIG. 7. The first protrusion 80-1 connecting the connection electrode 80 at the region Q6 corresponds to the output terminal of the pixel circuit 10, and the second protrusion 80-2 connecting the connection electrode 80 at the region Q5 corresponds to the second power supply structure 22. One light emitting device having its anode coupled with the output terminal of the pixel circuit 10 and its cathode coupled with the first protrusion 80-1 of the connection electrode 80 is fixed in the region Q6; the other light emitting device having its anode coupled with the second protrusion 80-2 of the connection electrode 80 and its cathode coupled with the second power supply structure 22 is fixed in the region Q5, and the positioning of the connection electrode 80 between the first power supply structure 21 and the second power supply structure 22 does not require adjusting the position of the pixel circuit and the signal line in the pixel region Q. This enables the arrangement of two light emitting devices in series within one pixel region Q. The greater the required brightness of the pixel region Q in a conventional arrangement, the greater the drive current that needs to be provided to the light emitting device, resulting in greater power consumption. The embodiments of the present disclosure provide two light emitting devices connected in series in one pixel region Q to achieve greater brightness in the pixel region at lower driving currents, thereby reducing power consumption. In addition, the requirement of the pixel circuit after the driving current is reduced is also reduced, and the performance requirement of the display driver chip is also reduced.

In addition, the output terminal 10-c of the pixel circuit 10 is illustrated in FIG. 10, and it can be seen that the opening in the second insulating layer 72 exposes the output terminal 10-c so that the electrode of the light emitting device can be coupled with the output terminal 10-c by the bonding process.

Figure 11:
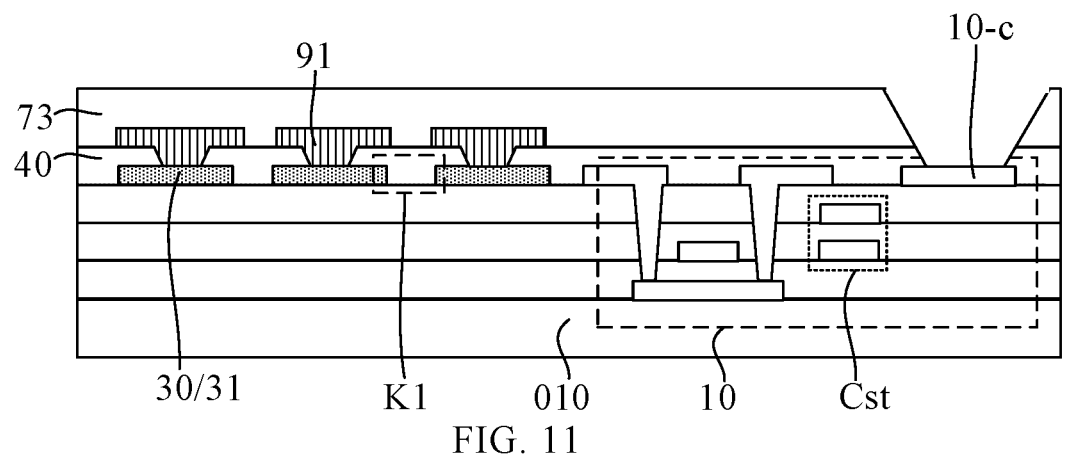
FIG. 11 is a schematic diagram of a membrane layer of another driving board according to an embodiment of the present disclosure.

In some embodiments, as shown in FIG. 11, the pixel region Q further includes a metal oxide layer 91 at a side of the block structure 30 away from the substrate 010, and the metal oxide layer 91 is coupled with the block structure 30. The block structure 30 includes a first block structure 31 having a first opening K1. Features of the first block structure 31 may be understood with reference to relevant embodiments described above. The first block structure 31 in FIG. 11 belongs to a first power supply structure 21, which is a positive power supply structure Pvdd. That is, a metal oxide layer 91 is provided at a side of the first power supply structure 21 away from the substrate 010, the metal oxide layer 91 being coupled with the first power supply structure 21. In this embodiment, the block structure 30 is a positive power supply structure, and electrochemical corrosion preferentially occurs on the metal oxide layer 91 during application, so that the metal oxide layer 91 can be used to improve the resistance of the block structure 30 to electrochemical corrosion and improve the stability of the driving board performance.

In some embodiments, the metal oxide layer 91 includes at least one of indium tin oxide, indium zinc oxide, zinc oxide, or indium oxide.

In other embodiments, the block structure 30 of FIG. 11 belongs to a second power supply structure 22, that is, a metal oxide layer 91 is provided at a side of the second power supply structure 22 away from the substrate 010, and the metal oxide layer 91 is coupled with the second power supply structure 22. The figures are not illustrated herein.

In some embodiments, the block structure 30 further includes a second block structure 32 located at a side of the first block structure 31 away from the substrate 010. For the second block structure 32, reference may be made to the relevant embodiments described above. The metal oxide layer 91 is located at a side of the second block structure 32 away from the substrate 010, and the metal oxide layer 91 is coupled with the second block structure 32 and is not illustrated herein.

As shown in FIG. 11, a third insulating layer 73 is also provided at the side of the metal oxide layer 91 away from the substrate 010, the third insulating layer 73 optionally includes an organic material, and the third insulating layer 73 is capable of planarizing after the metal oxide layer 91. The output terminal 10-c of the pixel circuit 10 is also illustrated in FIG. 11, and it can be seen that the opening in the third insulating layer 73 and the opening in the inorganic layer 40 overlap and collectively expose the output terminal 10-c, so that the electrode of the light emitting device can be coupled with the output terminal 10-c by the bonding process.

As shown in FIG. 11, there is an inorganic layer 40 between the metal oxide layer 91 and the block structure 30, that is, the insulating layer between the metal oxide layer 91 and the block structure 30 is an inorganic material. The metal oxide layer 91 and the block structure 30 are coupled through a via penetrating the inorganic layer 40. In the fabrication of the driving board, the inorganic layer 40 is first fabricated after the processes of the block structure 30, and then the metal oxide layer 91 is fabricated after the processes of the inorganic layer 40, and the metal oxide layer 91 includes an etching process. The inorganic layer 40 formed before the process of forming the metal oxide layer 91 can protect the underlying metal structure, preventing the etching solution in the etching process of the metal oxide layer 91 from over-etching the underlying metal structure.

Figure 12:
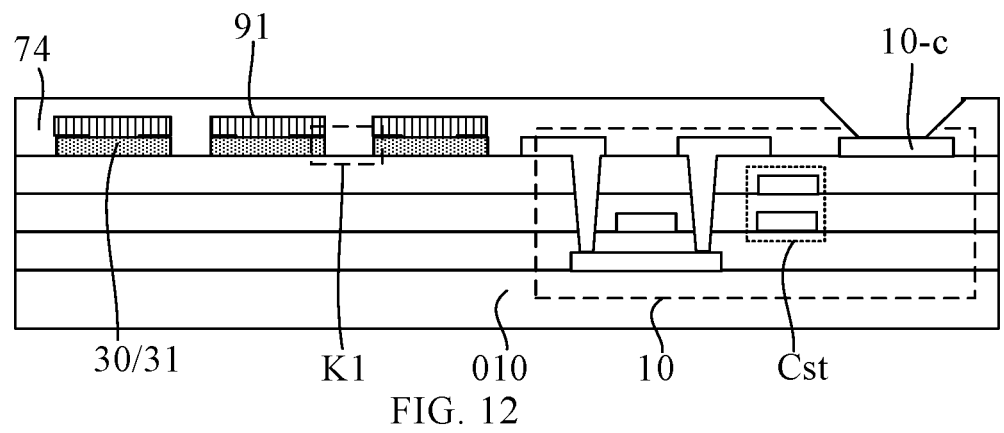
FIG. 12 is a schematic diagram of a membrane layer of another driving board according to an embodiment of the present disclosure.

In another embodiment, as shown in FIG. 12, which is a film layer of another driving board provided by the embodiment of the present disclosure, the metal oxide layer 91 is in direct contact with the surface of the block structure 30 away from the substrate 010. With the metal oxide layer 91 overlying the surface of the block structure 30 coupled with the block structure 30, this embodiment can improve the resistance of the block structure 30 to galvanic corrosion and improve driving board performance stability. The patterning process of the metal oxide layer 91 and the patterning process of the block structure 30 can be performed using the same mask, which can reduce the process cost.

In addition, as shown in FIG. 12, a fourth insulating layer 74 is provided at a side of the metal oxide layer 91 away from the substrate 010. Optionally, the fourth insulating layer 74 includes at least one inorganic layer, which takes advantage of the superior ability of inorganic materials to block water and oxygen, which improves the performance reliability of the driving board in high temperature, high humidity operating environments.

Figure 13:
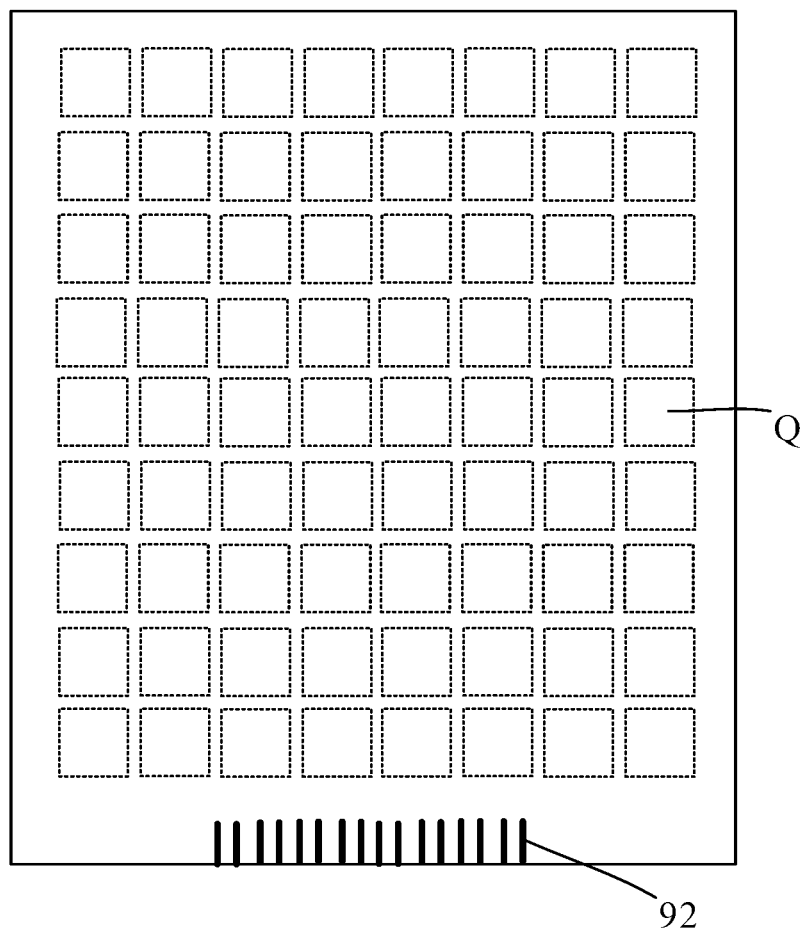
FIG. 13 is a schematic diagram of another driving board according to an embodiment of the present disclosure.
Figure 14:
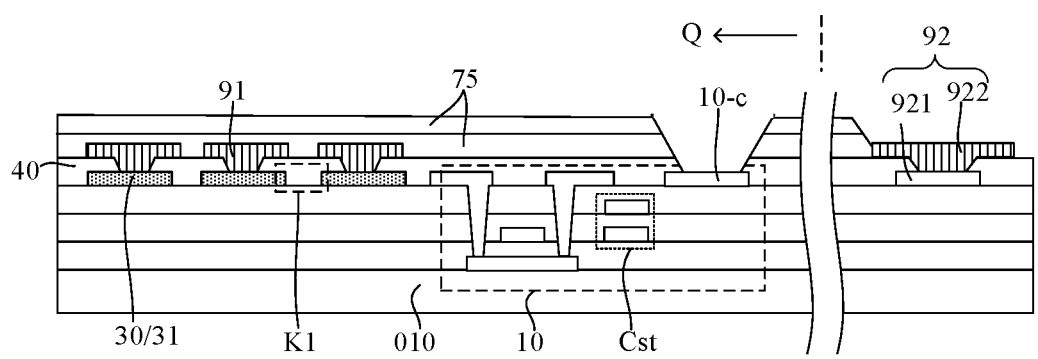
FIG. 14 is a schematic diagram of a membrane layer of another driving board according to an embodiment of the present disclosure.

In some embodiments, FIG. 13 is a schematic diagram of another driving board provided by the embodiment, and FIG. 14 is a schematic diagram of a membrane layer of another driving board provided by the embodiment. As shown in FIG. 13, the driving board includes a plurality of pads 92, and the pads 92 are located at the periphery of the plurality of pixel regions Q; the pads 92 are used for bonding with a driving structure, such as a display driver chip or a flexible circuit board.

As shown in FIG. 14, the pad 92 is located at the same side of the substrate 010 as the pixel circuit 10. The pad 92 includes a metal portion 921 and a metal oxide portion 922, the metal oxide portion 922 is located at a side of the metal portion 921 away from the substrate 010, and the metal oxide portion 922 and the metal oxide layer 91 is located on the same layer. The metal oxide portion 922 can protect the metal portion 921 from corrosion. The metal oxide portion 922 and metal oxide layer 91 can be fabricated in the same process, which can simplify the process.

As understood in connection with the film layer structure of the driving board illustrated in the embodiment of FIG. 6, in one embodiment, the metal portion 921 is located in the second metal layer 012, the metal portion 921 includes a titanium/aluminum/titanium tri-layer metal structure, and the hardness of the metal portion 921 is relatively small. While in the bonding process, such as bonding the driving board and the flexible circuit board, the conductive particles in the anisotropic conductive paste between the pads and the flexible circuit board need to exert a large pressure to be able to be crushed. In the embodiment of the present disclosure, the metal oxide portion 922 is provided on the metal portion 921, and since the metal oxide portion 922 is relatively hard, the conductive particles in the anisotropic conductive paste can be broken by using less pressure in the binding process, reducing the process difficulty.

In addition, as shown in FIG. 14, the insulating layer between the metal oxide layer 91 and the first block structure 31 is an inorganic layer 40. A fifth insulating layer 75 is also provided at the side of the metal oxide layer 91 away from the substrate 010. The fifth insulating layer 75 illustrated in FIG. 14 includes two inorganic layers.

In some embodiments, the inorganic layer at the side of the block structure 30 away from the substrate 010 includes a first inorganic layer in contact with the block structure 30. That is, when the driving board is formed, a layer of inorganic layer is directly formed after the block structure 30 is processed to protect the block structure 30 by the inorganic layer.

In the embodiment of FIG. 4, the block structure 30 includes a first block structure 31, the inorganic layer 40 is a first inorganic layer, and the inorganic layer 40 is in direct contact with the first block structure 31 at a side of the first block structure 31 away from the substrate 010. In the embodiment of FIG. 10, the block structure 30 includes a first block structure 31 and a second block structure 32, where the second insulating layer 72 includes a first inorganic layer contacting the second block structure 32 at a side of the second block structure 32 away from the substrate 010.

In some embodiments, the driving board includes a first organic layer at the side of the block structure 30 away from the substrate 010, and a first organic layer at the side of at least one inorganic layer away from the block structure 30. When the film layer of the block structure 30 has a relatively large thickness, a relatively thin inorganic layer formed on the block structure 30 may not completely cover the edge slope location of the block structure 30, and a defect exists, the embodiment of the present disclosure further forms a first organic layer with a thicker thickness after the inorganic layer process, the first organic layer is thicker and has a certain flowability to cover the slope location well in the beginning of the manufacturing process, and this arrangement ensures that the block structure 30 is completely covered and prevents the exposed portion of the block structure 30. With good barrier water oxygen capability of the inorganic layer, the block structure 30 is protected from corrosion by the block structure 30, and the organic layer on top of the inorganic layer can further improve the corrosion resistance while also functioning as a planarization.

In embodiments where the block structure 30 includes the first block structure 31, at least one inorganic layer is provided at a side of the first block structure 31 away from the substrate 010. In some embodiments, the inorganic layer is in direct contact with the first block structure 31 at a side of the first block structure 31 away from the substrate 010. In other embodiments, the insulating layer at the side of the first block structure 31 away from the substrate 010 is an inorganic insulating layer. In other embodiments, the side of the first block structure 31 away from the substrate 010 is further provided with an organic insulating layer, and at least one inorganic layer is provided between the organic insulating layer and the first block structure 31.

In an embodiment where the block structure 30 includes a first block structure 31 and a second block structure 32, the first block structure 31 is located at a side of the second block structure 32 close to the substrate 010, and at least one inorganic layer is provided at a side of the second block structure 32 further from the substrate 010. In some embodiments, at least one inorganic layer is in direct contact with the second block structure 32 at a side of the second block structure 32 away from the substrate 010. In other embodiments, the insulating layer at the side of the second block structure 32 away from the substrate 010 is an inorganic insulating layer. In other embodiments, the side of the second block structure 32 away from the substrate 010 is further provided with an organic insulating layer, and at least one inorganic layer is provided between the organic insulating layer and the second block structure 32. In other embodiments, the insulating layer between the first block structure 31 and the second block structure 32 includes at least one inorganic layer. In other embodiments, an organic insulating layer and an inorganic insulating layer are included between the first block structure 31 and the second block structure 32, where the inorganic insulating layer is at a side of the organic insulating layer near the substrate 010.

In some embodiments, as shown in FIGS. 3 and 4, the first power supply structure 21 and the second power supply structure 22 each include a first block structure 31, and the first block structure 31 of the first power supply structure 21 and the first block structure 31 of the second power supply structure 22 are on the same layer. This embodiment provides both the positive power supply structure and the negative power supply structure in a large-sized configuration, which reduces the resistance of the power supply structure, reduces the voltage drop across the power supply structure, improves the uniformity of the power supply voltage signal in each pixel region Q of the driving board, and also reduces power consumption. By partially separating the large-sized power supply structure from the small-sized power supply unit using the first opening K1, the presence of the first opening K1 causes the large-sized power supply structure to have a smaller cross-sectional area, which limits the mutual flow of electrical charges between the small-sized power supply unit separated by the first opening K1, which is equivalent to distributing the electrical charges present on the large-sized power supply structure to reduce the amount of electrical charges accumulated in the small-sized power supply unit, that is, to reduce the amount of electrical charges locally accumulated in the large-sized power supply structure. The module is placed in the CVD tool after the large-sized power supply structure process to fabricate the inorganic insulating layer, which can reduce the risk of abnormal discharge between the large-sized power supply structure and the CVD tool, which can improve process yield and reduce cost. The first block structure 31 of the two power supply structures is provided at the same layer, which can simplify the manufacturing process.

Figure 15:
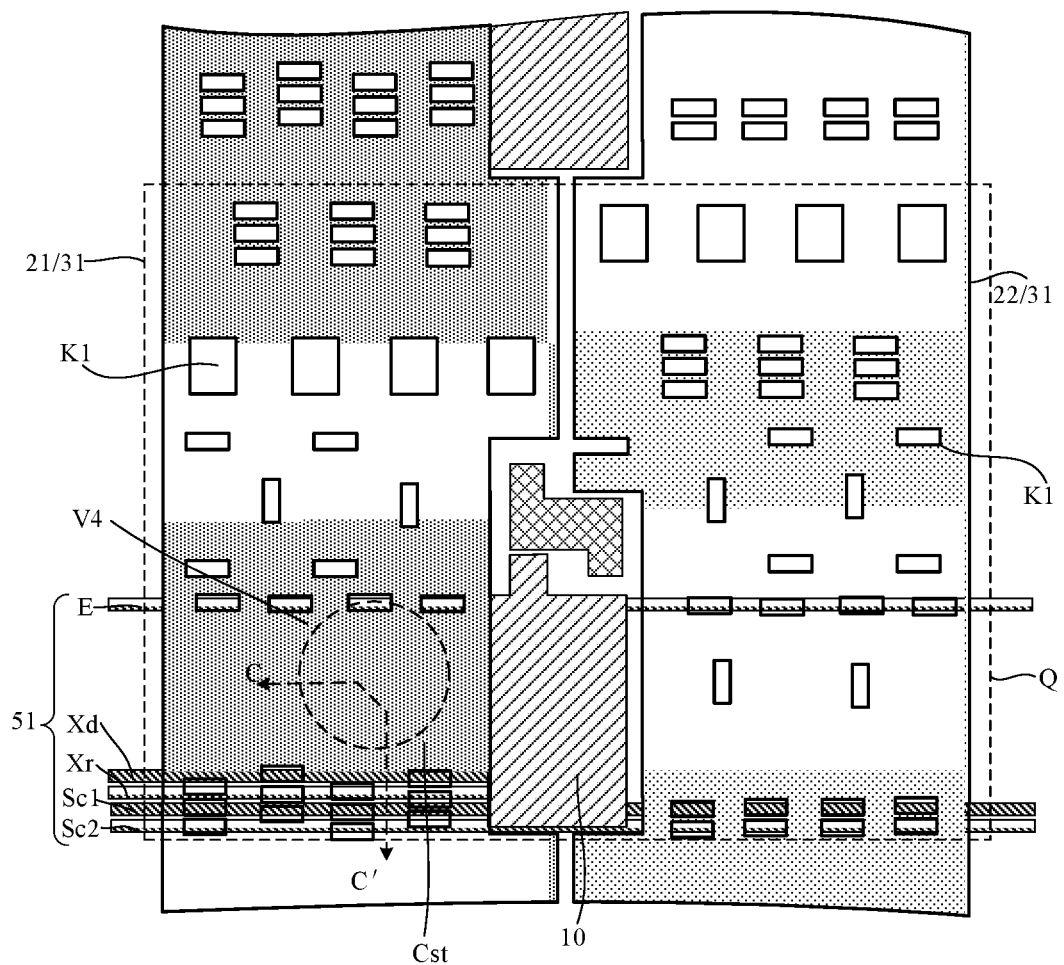
FIG. 15 is a schematic diagram of another driving board according to an embodiment of the present disclosure.
Figure 16:
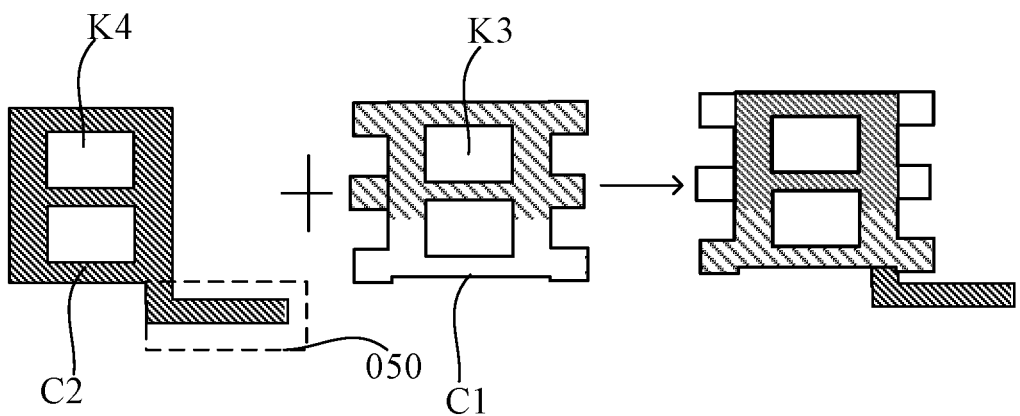
FIG. 16 is an exploded view of the storage capacitor of FIG. 15 according to an embodiment of the present disclosure.
Figure 17:
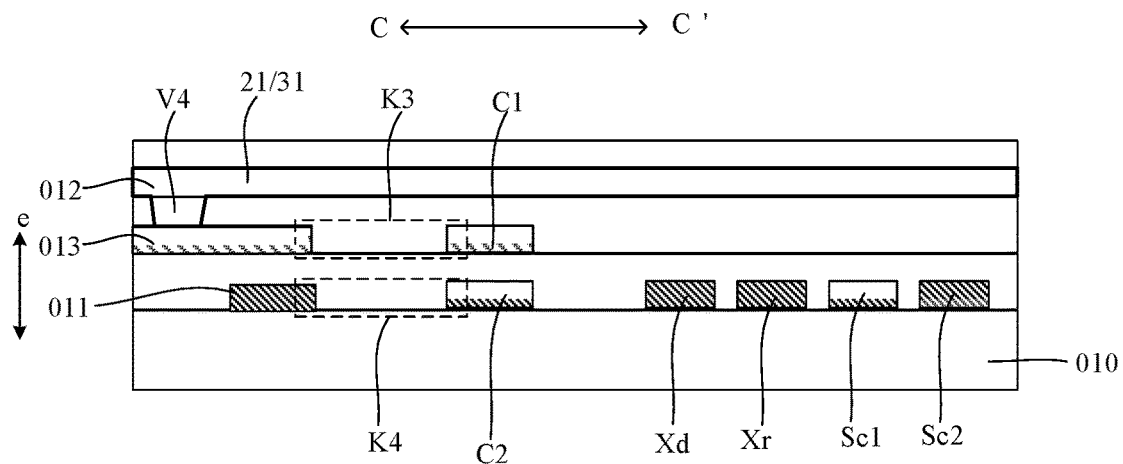
FIG. 17 is a cross-sectional view taken along line C-C' shown in FIG. 15 according to an embodiment of the present disclosure.

In one embodiment, FIG. 15 is a schematic diagram of another driving board provided by the embodiment of the present disclosure, FIG. 16 is an exploded view of the storage capacitor shown in FIG. 15, and FIG. 17 is a cross-sectional view taken along line C-C' shown in FIG. 15. The storage capacitor Cst is illustrated in FIG. 15, and as shown in FIG. 16, the storage capacitor includes a first plate C1 and a second plate C2, and the first plate C1 and the second plate C2 overlap to form a capacitor in a direction perpendicular to the plane of the substrate 010. The first plate C1 has a third opening K3, and the second plate C2 has a fourth opening K4 overlapping the third opening K3 and the fourth opening K4 in a direction e perpendicular to the plane of the substrate 010. The first plate C1 is illustrated in FIG. 15 connected to the via V4 of the first power supply structure 21. It is understood that the first plate C1 is coupled with the positive power supply structure Pvdd and the second plate C2 is coupled with the gate of the driving transistor Tm in conjunction with the pixel circuit 10 illustrated in FIG. 1 or FIG. 2, and the specific position of the driving transistor Tm is not shown in FIG. 15, but the connecting wire 050 drawn from the second plate C2 is connected to the gate of the driving transistor Tm. As shown in FIG. 17, the second plate C2 is provided on the first metal layer 011, the first plate C1 is provided on the capacitor metal layer 013, and the first power supply structure 21 is provided on the second metal layer 012. The first metal layer 011, the capacitor metal layer 013, and the second metal layer 012 are provided away from the substrate 010. The first metal layer 011 and the capacitor metal layer 013 are two adjacent metal layers, and two plates on which the storage capacitor Cst is provided are located in the first metal layer 011 and the capacitor metal layer 013, respectively. The thickness of the insulating layer between the first plate C1 and the second plate C2 is thin, and it is not necessary to size the first plate C1 and the second plate C2 too large in a case where the capacitance requirement of the storage capacitor Cst is satisfied. In addition, some of the signal lines in the driving board are provided on the first metal layer 011, the first power supply structure 21 and the second power supply structure 22 are provided on the second metal layer 012, and at least two insulating layers are provided between the signal lines and the power supply structure, the two insulating layers being insulating layers between the first metal layer 011 and the capacitor metal layer 013, and insulating layers between the capacitor metal layer 013 and the second metal layer 012, respectively. The arrangement is such that the separation distance between the signal lines and the power supply structures is large along a direction perpendicular to the plane of the substrate 010, and the capacitance formed when overlapping between the two is relatively small, which reduces the loading on the signal lines and on the power supply structures.

In the embodiment of the present disclosure, openings are respectively formed in the first plate C1 and the second plate C2 of the storage capacitor Cst to partially block the large-sized first plate C1 by the third opening K3, and to partially block the large-sized second plate C2 by the fourth opening K4, and provided in a direction e perpendicular to the plane of the substrate 010, where the third opening K3 and the fourth opening K4 overlap with each other. When the capacitance of the storage capacitor Cst formed by overlapping the first plate C1 and the second plate C2 satisfies the requirement, it is also possible to prevent an abnormal discharge when too much charge accumulated locally on the first plate C1 or the second plate C2 causes the module to enter the CVD tool. In the embodiment of FIG. 16, only the first plate C1 has two third openings K3 and the second plate C2 has two fourth openings K4. In the embodiment of the present disclosure, the number of openings and the area of the openings provided in the two plates of the storage capacitor Cst are not limited. In some embodiments, the distance between two adjacent third openings K3 is not greater than 1 mm, and the distance between two adjacent fourth openings K4 is not greater than 1 mm. The manner in which the distance between adjacent openings is calculated may be understood with reference to the description above regarding the embodiment of FIG. 3.

Figure 18:
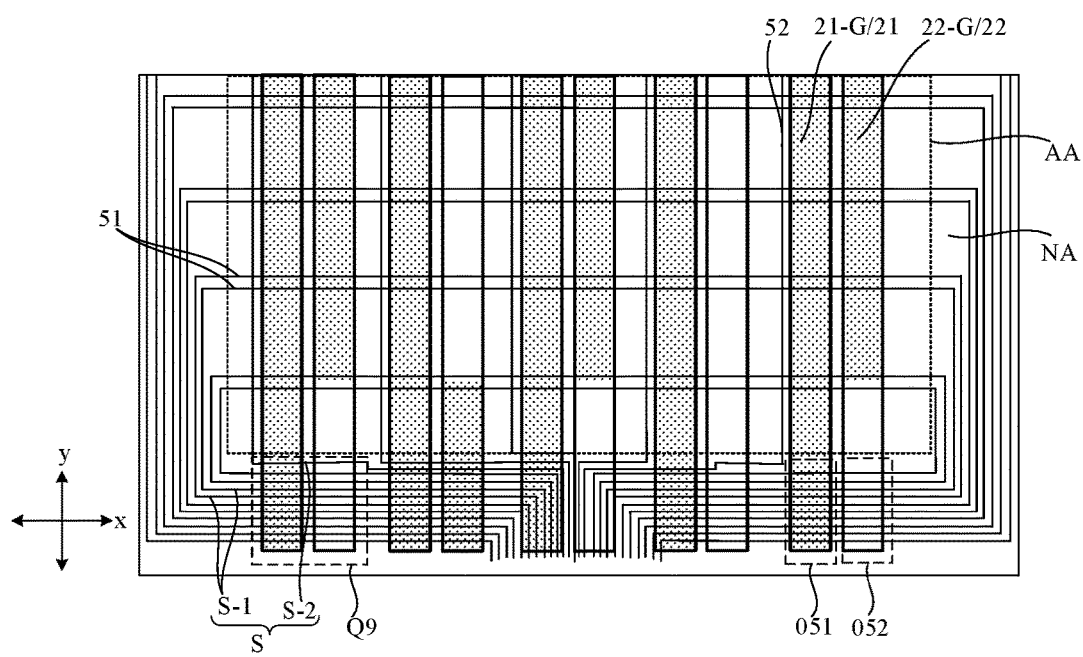
FIG. 18 is a partial schematic diagram of another display panel according to an embodiment of the present disclosure.
Figure 19:
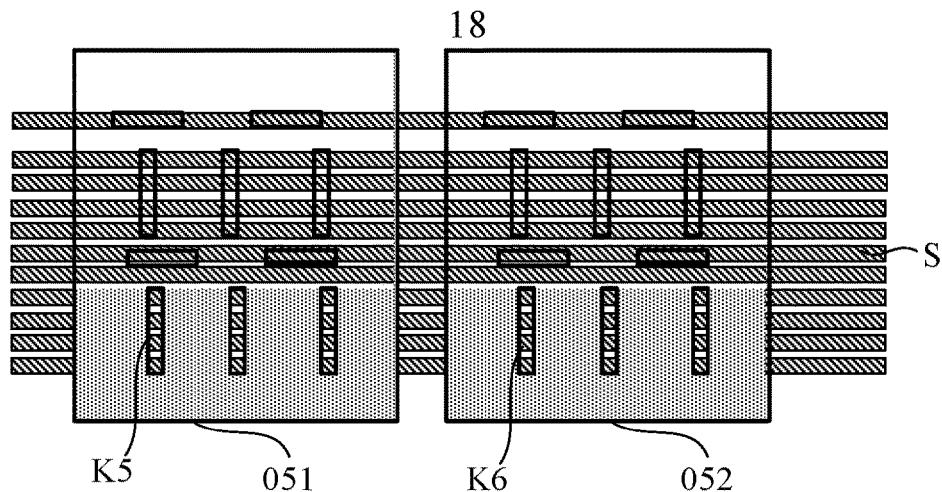
FIG. 19 is an enlarged view of the area Q9 in FIG. 18 according to an embodiment of the present disclosure.

In some embodiments, FIG. 18 is a partial schematic diagram of another driving board provided by the embodiment of the present disclosure, and FIG. 19 is an enlarged schematic diagram of FIG. 18 at location Q9. As shown in FIG. 18, the driving board includes a display region AA and a non-display region NA provided with a plurality of fan-out lines S. The fan-out line S has one end connected to the driving signal line in the display region AA and the other end connected to the pad of the non-display region BA for bonding the driving chip or the flexible circuit board. The fan-out wire S includes a first fan-out wire S-1 coupled with a first driving signal line 51 extending in the first direction x in the display region AA and a second fan-out wire S-2 coupled with a second driving signal line 52 extending in the second direction y in the display region AA. In one embodiment, the first fan-out lead S-1 includes at least a scan fan-out line coupled with a scan line within the display region AA and a lighting control fan-out line coupled with a lighting control line within the display region AA. The second fan-out wire S-2 includes at least a data fan-out wire coupled with a data line within the display region AA.

The first power supply structure 21 and the second power supply structure 22 within the display region AA are illustrated in FIG. 18, but the pixel regions Q within the display region AA are not labeled. From the above descriptions of the embodiments, it can be seen that the first power supply structures 21 in the respective pixel regions Q arranged in the second direction y in the display region AA are interconnected to form a first common power source 21-G, and the second power supply structures 22 in the respective pixel regions Q arranged in the second direction y are interconnected to form a second common power source 22-G. From the top view of the driving board, the first common power source 21-G in the display region AA and the second common power source 22-G in the display region AA both look like a strip. In addition, in the display region AA, the first common power sources 21-G and the second common power sources 22-G are alternately arranged along the first direction x. It should be noted that, only the shape of the first common power source 21-G and the second common power source 22-G in the display region AA is illustrated in FIG. 18, the openings provided on the first power supply structure 21 and the second power supply structure 22 are not illustrated.

The non-display region NA includes a first power supply structure 051 and a second power supply structure 052, and a power supply voltage terminal (not shown in FIG. 18) is further provided in the display region NA. The power supply voltage terminal includes a first power supply voltage terminal and a second power supply voltage terminal, the first power supply structure 051 is connected to the first power supply voltage terminal, and the second power supply structure 052 is connected to the second power supply voltage terminal. The first power supply structure 051 and the second power supply structure 052 in the non-display region NA are both large-sized structures.

As can be seen in FIG. 18, the first power supply structure 051 is connected to the first common power source 21-G in the display region AA, that is, the first common power source 21-G is connected to the first power supply voltage terminal through the first power supply structure 051 in the non-display region NA. The first power supply structure 051 and the first common power source 21-G are an integral structure. The first power supply structure 051 in the non-display region NA is insulated and overlapped with the plurality of fan-out lines S. In one embodiment, the fan-out line S is on the first metal layer 011 and the first power supply structure 051 is on the second metal layer 012.

As shown in FIG. 19, in the embodiment of the present disclosure, the first power supply structure 051 is provided with a fifth opening K5 for partially separating a large-sized first power supply structure 051 into a plurality of small-sized structures that are still electrically connected to each other, and since the presence of the fifth opening K5 reduces the cross-sectional area of the first power supply structure 051 in which the electric charge flowing through the first power supply structure 051 decreases, thereby limiting the mutual flow of electric charge between the small-sized structures separated by the fifth opening K5, which is equivalent to distributing the electric charge present on the first power supply structure 051, reducing the amount of electric charge accumulated in the small-sized structures, and reducing the amount of electric charge accumulated at the local location on the first power supply structure 051. When the driving board is manufactured, the amount of charges accumulated in each small-sized structure of the first power supply structure 051 is reduced, and the risk of less ESD occurs, the risk of abnormal discharge between each small-sized structure and the CVD tool is reduced, and the risk of abnormal discharge between the first power supply structure 051 and the CVD tool is reduced. Embodiments of the present disclosure enable fabrication of inorganic layers after processing of the first power supply structure 051 to effectively protect the first power supply structure 051. In a direction perpendicular to the plane of the substrate 010, the first power supply structure 051 overlaps the plurality of fan-out lines S, and disposing the fifth opening K5 to overlap the fan-out lines can reduce the capacitance formed by overlapping the first power supply structure 051 and the fan-out lines S, thereby reducing the loading on the fan-out lines S.

Similarly, the second power supply structure 052 is connected to the second common power source 22-G in the display region AA, and the second common power source 22-G is connected to the second power supply voltage terminal through the second power supply structure 052 in the non-display region NA. The second power supply structure 052 and the first common power source 21-G are an integral structure, the second power supply structure 052 and the second common power source 22-G are on the same layer, and the second power supply structure 052 is on the second metal layer 012. As shown in FIG. 19, in the embodiment of the present disclosure, the second power supply structure 052 is provided with a sixth opening K6 for partially separating a large-sized second power supply structure 052 into a plurality of small-sized structures that are still electrically connected to each other, and since the presence of the sixth opening K6 makes the cross-sectional area of the second power supply structure 052 smaller in the charge flow inside the second power supply structure 052, the charge is restricted from passing between the small-sized structures separated by the sixth opening K6, and the amount of charge accumulated in the small-sized structures can be reduced, and the amount of charge accumulated in the second power supply structure 052 is reduced. When the driving board is manufactured, the amount of charge accumulated in each small-sized structure of the second power supply structure 052 is reduced, and the risk of less ESD occurs, the risk of abnormal discharge between each small-sized structure and the CVD tool is reduced, and the risk of abnormal discharge between the second power supply structure 052 and the CVD tool is reduced. Embodiments of the present disclosure enable the fabrication of inorganic layers after the processing of the second power supply structure 052 to effectively shield the second power supply structure 052. In a direction perpendicular to the plane of the substrate 010, there is an overlap between the second power supply structure 052 and the plurality of fan-out lines S in the fan-out region SQ, and disposing the sixth opening K6 to overlap the fan-out lines can reduce the capacitance formed by the overlap between the second power supply structure 052 and the fan-out lines S, thereby further reducing the loading on the fan-out lines S.

In the embodiment of the present disclosure, the number and the area of the fifth opening K5 and the sixth opening K6 are not limited. In some embodiments, the distance between adjacent fifth openings K5 is no greater than 1 mm, and the distance between adjacent sixth openings K6 is no greater than 1 mm. The manner in which the distance between adjacent openings is calculated may be understood with reference to the description above regarding the embodiment of FIG. 3.

In some embodiments, as understood in connection with the embodiment of FIG. 6 described above, the display panel includes a first metal layer 011, a second metal layer 012, and a capacitive metal layer 013 that are located at a same side of the substrate 010, and the capacitive metal layer 013 is located between the first metal layer 011 and the second metal layer 012. The first power supply structure 051 and the second power supply structure 052 are located on the second metal layer 012, and the fan-out line S is located on the first metal layer 011.

It should be noted that the line shape and the extending direction of the fan-out line S shown in FIG. 18 are only for illustrative purposes and are not meant to be limitations of the present disclosure. Some line segments in the fan-out line S may be straight lines or broken lines. In some embodiments, the first direction x and the second direction y are perpendicular to each other, and the extending direction of at least some of the line segments in the fan-out line S forms a non-zero angle with the first direction x and also forms a non-zero angle with the second direction.

Figure 20:
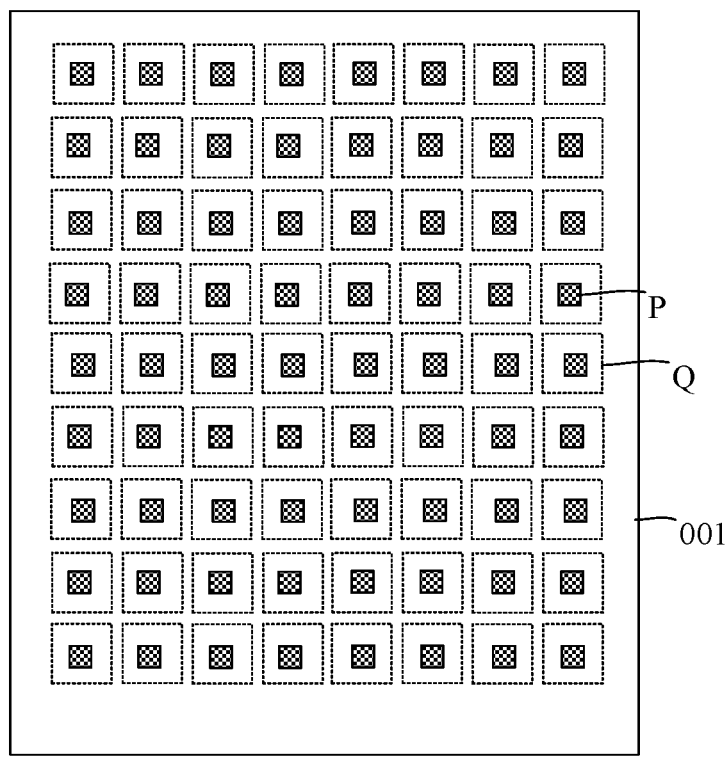
FIG. 20 shows a display panel according to an embodiment of the present disclosure.

In view of the same invention concept, the embodiment of the present disclosure further provides a display panel, and FIG. 20 is a schematic diagram of the display panel provided by the embodiment of the present disclosure. As shown in FIG. 20, the display panel includes a driving board 001 provided by any of the embodiments of the present disclosure. The driving board 001 includes a plurality of pixel regions Q, and the display panel further includes a plurality of light-emitting devices P; and one of the pixel regions Q overlaps at least one of the light-emitting devices P in a direction perpendicular to the plane of the substrate. In FIG. 20, one light emitting device P is provided in one pixel region Q. In some embodiments, two or more numbers of light emitting devices P connected in series are provided within one pixel region Q and are not illustrated herein.

Figure 21:
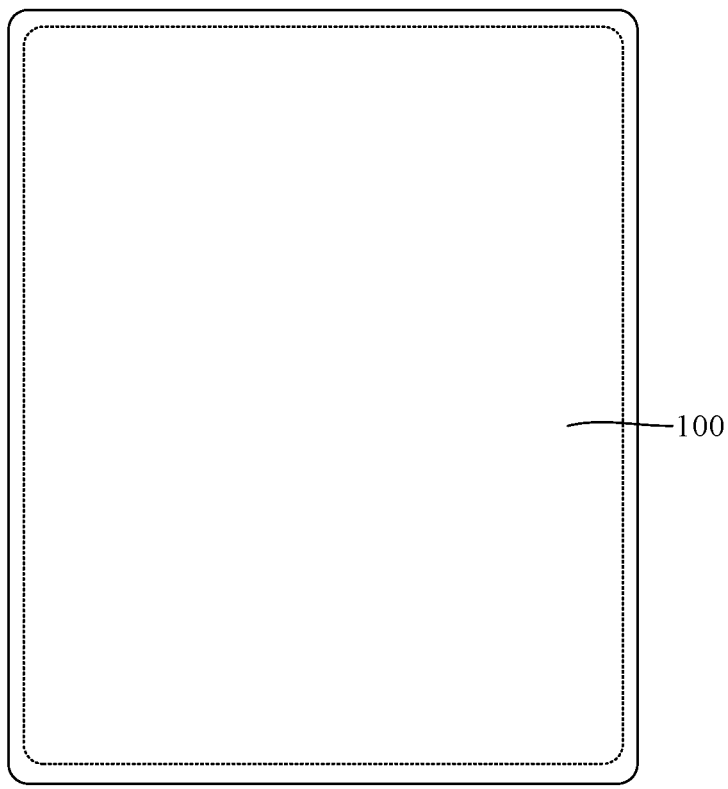
FIG. 21 is a schematic diagram of a display device according to an embodiment of the present disclosure.

According to the same invention concept, the embodiment of the present disclosure provides a display device, and FIG. 21 is a schematic diagram of the display device provided by the embodiment of the present disclosure, and as shown in FIG. 21, the display device includes a display panel 100 provided by any of the embodiments. The structure of the display panel 100 is described in the above embodiments, and is not repeated herein. Embodiments of the present disclosure provide a display device such as a mobile phone, a tablet computer, a laptop computer, a television, and the like.

The above description merely illustrates some embodiments of the present disclosure, and is not intended to limit the present disclosure. Any modifications, equivalent replacements, improvements, and the like made within the principle of the present disclosure shall fall within the protection scope of the present disclosure.

Finally, it should be noted that the foregoing embodiments are merely intended to describe and not to limit the technical solutions of the present disclosure. Although the present disclosure has been described in detail with reference to the foregoing embodiments, persons skilled in the art should understand that they can still make modifications to the technical solutions described in the foregoing embodiments or make equivalent replacements to some or all of the technical features thereof. These modifications or replacements do not make the essence of the corresponding technical solutions deviate from the scope of the technical solutions of the embodiments of the present disclosure.

What is claimed is:

1. A driving board, comprising:
    pixel regions, wherein each one of the pixel regions comprises a pixel circuit, a first power supply structure configured to provide a first power voltage, and a second power supply structure configured to provide a second power voltage; and
    a substrate,
    wherein the pixel circuit, the first power supply structure, and the second power supply structure are located at a same side of the substrate;
    wherein at least one of the first power supply structure and the second power supply structure comprises a block structure, and at least one inorganic layer is provided at a side of the block structure away from the substrate; and
    wherein the block structure comprises a first block structure comprising at least one first opening.

2. The driving board according to claim 1, wherein the first block structure comprises at least two first openings, and a first distance D1 between adjacent two of the at least two first openings satisfies $D1 \leq 1$ mm.

3. The driving board according to claim 1, further comprising: a first signal line extending in a first direction, wherein the first signal line and the pixel circuit are located at a same side of the substrate, and the first signal line overlaps with the at least one first opening in a direction perpendicular to a plane of the substrate.

4. The driving board according to claim 3, wherein the first power supply structure and the second power supply structure are adjacent to each other along the first direction in the pixel region;
    the first signal line comprises a power connection line, wherein the power connection line comprises a first power connection line configured to electrically connect two first power supply structures adjacent to each other along the first direction, and a second power connection line configured to electrically connect two second power supply structures adjacent to each other along the first direction; and
    the first block structure overlaps with one of the first power connection line and the second power connection line in a direction perpendicular to the plane of the substrate.

5. The driving board according to claim 4, wherein the first opening comprises a first sub-opening and a second sub-opening, the first sub-opening having a larger area than the second sub-opening; the power connection line overlaps with at least one first sub-opening in the direction perpendicular to the plane of the substrate.

6. The driving board according to claim 3, wherein the first signal line comprises a first driving signal line coupled with the pixel circuit.

7. The driving board according to claim 6, wherein the first opening comprises a first sub-opening and a second sub-opening, the first sub-opening having a larger area than the second sub-opening; and
    the driving signal line overlaps with at least one second sub-opening in the direction perpendicular to the plane of the substrate.

8. The driving board according to claim 6, further comprising: a second driving signal line extending in a second direction, wherein the second direction crosses the first direction, the second driving signal line is located between two-pixel regions adjacent to each other along the first direction; and
    the second driving signal line and the first driving signal line are located on different layers, and some first driving signal lines are coupled with the second driving signal line.

9. The driving board according to claim 3, further comprising a first metal layer and a second metal layer that are located at a same side of the substrate, wherein the second metal layer is located at a side of the first metal layer away from the substrate; and the first driving signal line is located on the first metal layer, and the first block structure is located on the second metal layer.

10. The driving board according to claim 1, further comprising an auxiliary power supply structure; and
the auxiliary power supply structure is connected to the first block structure by at least two vias, and is located at a side of the first block structure away from the substrate.

11. The driving board according to claim 10, wherein the block structure further comprises a second block structure at the side of the first block structure away from the substrate, the second block structure comprising at least one second opening; and
the auxiliary power supply structure comprises the second block structure.

12. The driving board according to claim 11, wherein the second block structure comprises at least two of the second openings, a second distance D2 between adjacent two second openings satisfies D2≤1 mm.

13. The driving board according to claim 11, wherein in one of the pixel regions, the at least one second opening has a total area S1, and the second block structure has an area S0, wherein S1/S0>0.1.

14. The driving board according to claim 11, wherein the at least one second opening comprises a third sub-opening; and an orthogonal projection of the third sub-opening on the substrate is located within an orthogonal projection of the first opening on the substrate.

15. The driving board according to claim 11, wherein the at least one second opening comprises a fourth sub-opening; and the fourth sub-opening does not overlap with the first opening in the direction perpendicular to the plane of the substrate.

16. The driving board according to claim 11, wherein an organic insulating layer is provided between the second block structure and the first block structure.

17. The driving board according to claim 10, wherein the auxiliary power supply structure and the first block structure are made of a same material.

18. The driving board according to claim 1, wherein the pixel region further comprises a metal oxide layer located at the side of the block structure away from the substrate, and the metal oxide layer is coupled with the block structure.

19. The driving board according to claim 18, wherein the metal oxide layer is in direct contact with a surface of the block structure at a side away from the substrate.

20. The driving board according to claim 18, wherein an insulating layer is provided between the metal oxide layer and the block structure, and the metal oxide layer and the block structure are coupled by a via extending through the insulating layer.

21. The driving board according to claim 18, comprising pads,
wherein the pads and the pixel circuit are located at a same side of the substrate, and the pads are located at a periphery of the pixel regions; and
each one of the pads comprises a metal portion and a metal oxide portion that are located on a same layer, and the metal oxide portion is located at a side of the metal portion away from the substrate.

22. The driving board according to claim 1, wherein each one of the pixel regions further comprises a connection electrode, the connection electrode has one end corresponding to an output end of the pixel circuit, and the other end corresponding to the second power supply structure.

23. The driving board according to claim 1, wherein the inorganic layer comprises a first inorganic layer in contact with the block structure.

24. The driving board according to claim 1, comprising a first organic layer, wherein the first organic layer is located at the side of the block structure away from the substrate, and is located at a side of at least one inorganic layer away from the block structure.

25. The driving board according to claim 1, wherein each one of the first power supply structure and the second power supply structure comprises the first block structure, and the first block structure of the first power supply structure and the first block structure of the second power supply structure are located on a same layer.

26. A display panel, comprising a driving board and light emitting devices,
wherein one of pixel regions overlaps with at least one of the light emitting devices in a direction perpendicular to a plane of a substrate;
wherein the driving board comprises:
pixel regions, wherein each one of the pixel regions comprises a pixel circuit, a first power supply structure configured to provide a first power voltage, and a second power supply structure configured to provide a second power voltage; and
the substrate,
wherein the pixel circuit, the first power supply structure, and the second power supply structure are located at a same side of the substrate;
wherein at least one of the first power supply structure and the second power supply structure comprises a block structure, at least one inorganic layer is provided at a side of the block structure away from the substrate; and
wherein the block structure comprises a first block structure comprising at least one first opening.

27. A display device, comprising a display panel, wherein the display panel comprises a driving board and light emitting devices, wherein one of pixel regions overlaps with at least one of the light emitting devices in a direction perpendicular to a plane of the substrate;
wherein the driving board comprises:
pixel regions, wherein each one of the pixel regions comprises a pixel circuit, a first power supply structure configured to provide a first power voltage, and a second power supply structure configured to provide a second power voltage; and
the substrate,
wherein the pixel circuit, the first power supply structure, and the second power supply structure are located at a same side of the substrate;
wherein at least one of the first power supply structure and the second power supply structure comprises a block structure, at least one inorganic layer is provided at a side of the block structure away from the substrate; and
wherein the block structure comprises a first block structure comprising at least one first opening.

* * * * *